United States Patent
Haba et al.

(10) Patent No.: US 12,513,855 B1
(45) Date of Patent: Dec. 30, 2025

(54) INTEGRATED COOLING ASSEMBLY WITH UPPER AND LOWER CHANNELS

(71) Applicant: Adeia Semiconductor Bonding Technologies Inc., San Jose, CA (US)

(72) Inventors: Belgacem Haba, Saratoga, CA (US); Gaius Gillman Fountain, Jr., Youngsville, NC (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 19/073,556

(22) Filed: Mar. 7, 2025

(51) Int. Cl.
| | |
|---|---|
| *H05K 7/20* | (2006.01) |
| *H05K 1/02* | (2006.01) |
| *H05K 3/30* | (2006.01) |

(52) U.S. Cl.
CPC ....... *H05K 7/20254* (2013.01); *H05K 1/0203* (2013.01); *H05K 3/305* (2013.01)

(58) Field of Classification Search
CPC ........... H05K 7/20927; H05K 7/20772; H05K 7/2089; H05K 7/20272; H05K 7/20781; H05K 7/20836; H05K 7/20254
See application file for complete search history.

(56) References Cited

U.S. PATENT DOCUMENTS

| | | |
|---|---|---|
| 1,032,695 A | 7/1912 | George et al. |
| 1,083,934 A | 1/1914 | Boehringer et al. |
| 4,274,479 A | 6/1981 | Eastman |
| 5,309,986 A | 5/1994 | Itoh |
| 5,522,452 A | 6/1996 | Mizuno et al. |
| 5,769,154 A | 6/1998 | Adkins et al. |

(Continued)

FOREIGN PATENT DOCUMENTS

| | | |
|---|---|---|
| CN | 109524373 A | 3/2019 |
| CN | 106911058 B | 2/2020 |

(Continued)

OTHER PUBLICATIONS

KoolMicro Inc. developed the World's First 2,000 W/cm2 Cooling Technology for High Heat Generation Chips, Press Release, 2 pages, downloaded from www.semiconductorpackagingnews.com/uploads/1/KoolMicro_High_Cooling_Power_Density.pdf on Nov. 22, 2023.

(Continued)

*Primary Examiner* — Adam B Dravininkas
(74) *Attorney, Agent, or Firm* — HALEY GUILIANO LLP

(57) ABSTRACT

Embodiments herein provide for fluidic cooling assemblies embedded within a device package and related manufacturing methods. In one embodiment, an integrated cooling assembly includes a semiconductor device and a cold plate attached to a backside of the semiconductor device. The cold plate includes an upper portion disposed vertically adjacent to the backside of the semiconductor device and a lower portion disposed between the upper portion of the cold plate and the backside of the semiconductor device. The upper portion includes upper coolant channels defined by upper cavity sidewalls. The lower portion includes lower coolant channels defined by lower cavity sidewalls. The upper cavity sidewalls extend downwardly into regions between adjacent lower coolant channels. The lower cavity sidewalls extend upwardly into regions between adjacent upper coolant channels.

20 Claims, 15 Drawing Sheets

(56) References Cited

U.S. PATENT DOCUMENTS

| | | | |
|---|---|---|---|
| 6,056,044 A | 5/2000 | Benson et al. | |
| 6,351,384 B1 | 2/2002 | Daikoku et al. | |
| 6,686,532 B1 | 2/2004 | Macris | |
| 6,729,339 B1 | 5/2004 | Boyd et al. | |
| 6,822,326 B2 | 11/2004 | Enquist et al. | |
| 6,902,987 B1 | 6/2005 | Tong et al. | |
| 7,289,326 B2 | 10/2007 | Heydari et al. | |
| 7,485,957 B2 | 2/2009 | Brandenburg et al. | |
| 7,511,372 B2 | 3/2009 | Chiu | |
| 7,523,617 B2 | 4/2009 | Venkatasubramanian et al. | |
| 7,622,324 B2 | 11/2009 | Enquist et al. | |
| 7,692,926 B2 | 4/2010 | Henderson et al. | |
| 7,957,137 B2 | 6/2011 | Prasher | |
| 7,978,473 B2 | 7/2011 | Campbell et al. | |
| 7,997,087 B2 | 8/2011 | Venkatasubramanian et al. | |
| 8,164,169 B2 | 4/2012 | Chrysler et al. | |
| 8,630,091 B2 | 1/2014 | Ward et al. | |
| 9,224,673 B2 | 12/2015 | Chen et al. | |
| 9,299,641 B2 | 3/2016 | Sekar et al. | |
| 9,355,932 B2 | 5/2016 | Ankireddi et al. | |
| 9,391,143 B2 | 7/2016 | Tong et al. | |
| 9,553,071 B1 | 1/2017 | Haba | |
| 9,741,638 B2 | 8/2017 | Hsieh et al. | |
| 9,741,663 B2 | 8/2017 | Ishikura et al. | |
| 9,741,696 B2 | 8/2017 | Katkar et al. | |
| 9,746,248 B2 | 8/2017 | Semenov et al. | |
| 9,768,149 B2 | 9/2017 | Vadhavkar et al. | |
| 9,818,723 B2 | 11/2017 | Haba | |
| 10,032,695 B2 | 7/2018 | Iyengar et al. | |
| 10,083,934 B2 | 9/2018 | Haba | |
| 10,157,818 B2 | 12/2018 | Chen et al. | |
| 10,170,392 B2 | 1/2019 | Chainer et al. | |
| 10,199,356 B2 | 2/2019 | Kinsley | |
| 10,312,221 B1 | 6/2019 | Agarwal et al. | |
| 10,332,823 B2 | 6/2019 | Chen et al. | |
| 10,461,059 B2 | 10/2019 | Koopmans et al. | |
| 10,694,641 B2 | 6/2020 | Basu et al. | |
| 10,978,427 B2 | 4/2021 | Li et al. | |
| 11,187,469 B2 | 11/2021 | Karesh | |
| 11,191,184 B2 | 11/2021 | Mizerak et al. | |
| 11,387,164 B2 | 7/2022 | Wu et al. | |
| 11,598,594 B2 | 3/2023 | Lewis et al. | |
| 11,996,351 B2 | 5/2024 | Hsiao et al. | |
| 2003/0157782 A1 | 8/2003 | Kellar et al. | |
| 2004/0184237 A1 | 9/2004 | Chang | |
| 2004/0251530 A1 | 12/2004 | Yamaji | |
| 2005/0126766 A1 | 6/2005 | Lee et al. | |
| 2005/0213301 A1 | 9/2005 | Prasher | |
| 2006/0042825 A1 | 3/2006 | Lu et al. | |
| 2006/0060331 A1 | 3/2006 | Glezer et al. | |
| 2006/0103011 A1 | 5/2006 | Andry et al. | |
| 2006/0130506 A1 | 6/2006 | Tain et al. | |
| 2007/0025082 A1 | 2/2007 | Lee et al. | |
| 2007/0107875 A1 | 5/2007 | Lee et al. | |
| 2007/0231969 A1 | 10/2007 | Chrysler et al. | |
| 2008/0096320 A1 | 4/2008 | Farrar | |
| 2009/0122491 A1 | 5/2009 | Martin et al. | |
| 2010/0116534 A1 | 5/2010 | Choi et al. | |
| 2010/0230805 A1 | 9/2010 | Refai-Ahmed | |
| 2010/0300202 A1 | 12/2010 | Joyce | |
| 2011/0129986 A1 | 6/2011 | Libralesso et al. | |
| 2012/0212907 A1* | 8/2012 | Dede | H01L 23/4735 361/689 |
| 2013/0044431 A1 | 2/2013 | Koeneman | |
| 2013/0050944 A1* | 2/2013 | Shepard | H01L 23/473 165/173 |
| 2013/0087904 A1 | 4/2013 | Clark et al. | |
| 2014/0126150 A1 | 5/2014 | Song et al. | |
| 2014/0239486 A1* | 8/2014 | Gohara | H05K 7/20927 257/714 |
| 2014/0254099 A1 | 9/2014 | Takeda | |
| 2015/0194363 A1 | 7/2015 | Jun et al. | |
| 2016/0276314 A1 | 9/2016 | Ching et al. | |
| 2016/0366793 A1* | 12/2016 | Kikuchi | F28F 9/0204 |
| 2017/0012016 A1 | 1/2017 | Joshi et al. | |
| 2017/0092565 A1 | 3/2017 | Chen et al. | |
| 2017/0103937 A1 | 4/2017 | Hsieh et al. | |
| 2017/0179001 A1* | 6/2017 | Brunschwiler | H01L 23/427 |
| 2018/0053730 A1 | 2/2018 | Shao et al. | |
| 2018/0087842 A1 | 3/2018 | Chainer et al. | |
| 2018/0090427 A1 | 3/2018 | Bernstein et al. | |
| 2018/0160565 A1 | 6/2018 | Parida | |
| 2018/0211900 A1 | 7/2018 | Gutala et al. | |
| 2018/0308783 A1 | 10/2018 | Refai-Ahmed et al. | |
| 2019/0008071 A1 | 1/2019 | Kim | |
| 2019/0355706 A1 | 11/2019 | Enquist et al. | |
| 2019/0385928 A1 | 12/2019 | Leobandung | |
| 2019/0385933 A1 | 12/2019 | Eid et al. | |
| 2020/0035583 A1 | 1/2020 | Beauchemin et al. | |
| 2020/0105639 A1 | 4/2020 | Valavala et al. | |
| 2020/0312742 A1 | 10/2020 | Lofgreen et al. | |
| 2020/0343160 A1 | 10/2020 | Mizerak et al. | |
| 2020/0350233 A1 | 11/2020 | Mizerak et al. | |
| 2020/0352053 A1 | 11/2020 | Mizerak et al. | |
| 2020/0395313 A1 | 12/2020 | Mallik et al. | |
| 2021/0066164 A1 | 3/2021 | Wu et al. | |
| 2021/0175143 A1 | 6/2021 | Yu et al. | |
| 2021/0183741 A1 | 6/2021 | Jha et al. | |
| 2021/0193548 A1 | 6/2021 | Wan et al. | |
| 2021/0193620 A1 | 6/2021 | Refai-Ahmed et al. | |
| 2021/0280497 A1 | 9/2021 | Brun et al. | |
| 2021/0288037 A1 | 9/2021 | Tao et al. | |
| 2021/0378106 A1 | 12/2021 | Iyengar et al. | |
| 2021/0378139 A1 | 12/2021 | Rice et al. | |
| 2021/0410329 A1 | 12/2021 | Yang et al. | |
| 2022/0037231 A1 | 2/2022 | Hsiao et al. | |
| 2022/0087059 A1 | 3/2022 | Sathyamurthy et al. | |
| 2022/0117115 A1 | 4/2022 | Malouin et al. | |
| 2022/0130734 A1 | 4/2022 | Chiu et al. | |
| 2022/0189850 A1 | 6/2022 | Liff et al. | |
| 2022/0210949 A1 | 6/2022 | Edmunds et al. | |
| 2022/0230937 A1 | 7/2022 | Malouin et al. | |
| 2022/0408592 A1 | 12/2022 | Malouin et al. | |
| 2023/0048500 A1 | 2/2023 | Malouin et al. | |
| 2023/0154828 A1 | 5/2023 | Haba et al. | |
| 2023/0156959 A1 | 5/2023 | Malouin et al. | |
| 2023/0207474 A1 | 6/2023 | Uzoh et al. | |
| 2023/0245950 A1 | 8/2023 | Haba et al. | |
| 2023/0284421 A1 | 9/2023 | Malouin et al. | |
| 2023/0298969 A1 | 9/2023 | Park et al. | |
| 2024/0038633 A1 | 2/2024 | Haba et al. | |
| 2024/0203823 A1 | 6/2024 | Uzoh et al. | |
| 2024/0222222 A1 | 7/2024 | Haba et al. | |
| 2024/0222226 A1 | 7/2024 | Haba | |
| 2024/0249995 A1 | 7/2024 | Haba | |
| 2024/0249998 A1 | 7/2024 | Gao et al. | |
| 2024/0266255 A1 | 8/2024 | Haba et al. | |
| 2024/0332128 A1 | 10/2024 | Uzoh et al. | |
| 2024/0332129 A1 | 10/2024 | Haba et al. | |

FOREIGN PATENT DOCUMENTS

| | | |
|---|---|---|
| CN | 111128976 A | 5/2020 |
| CN | 115719735 A | 2/2023 |
| DE | 10315225 A1 | 10/2004 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |
| WO | 2024/145475 A1 | 7/2024 |

OTHER PUBLICATIONS

"Microconvective Liquid Cooling for high power electronics," https://jetcool.com/technology/, downloaded Mar. 7, 2024, 6 pages.

"Single-Phase Direct-to-Chip Liquid Cooling," 13 pages, downloaded from https://jetcool.com/post/single-phase-direct-to-chip-liquid-cooling-microconvective-vs-microchannel-liquid-cooled-cold-plates/ on Mar. 7, 2024.

Benson D.A. et al., "Micro-Machined Heat Pipes in Silicon MCM Substrates", Sandia National Laboratories, Sandia Report: SAND97-0100-UC-704, printed Jan. 1997, 17 pages.

(56) References Cited

OTHER PUBLICATIONS

Colgan, Evan G., "A practical implementation of silicon microchannel coolers," Electronics Cooling, Nov. 1, 2007.

Francisco Pires, "Tsmc Exploring On-Chip, Semiconductor-Integrated Watercooling", tom's Hardware, retrieved from <https://www.tomshardware.com/news/tsmc-exploring-on-chip-semiconductor-integrated-watercooling> Jul. 13, 2021, 23 pages.

IBM, "Functional electronic packaging-Thermal management roadmap", available online at <https://web.archive.org/web/20170220095511/https://www.zurich.ibm.com/st/electronicpackaging/cooling.html>, Feb. 20, 2017, 7 pages.

John H, "Recent Advances and Trends in Advanced Packaging", IEEE Transactions on Components, Packaging and Manufacturing Technology, IEEE, USA, vol. 12, No. 2, Jan. 20, 2022, pp. 228-252.

John H., "Chapter 3: Multiple System and Heterogeneous Integration with TSV-Interposers" In: "Chiplet Design and Heterogeneous Integration Packaging", Mar. 28, 2023, Springer Nature Singapore, Singapore, pp. 137-269.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

Kaplan, F. et al., "LoCool: Fighting Hot Spots Locally for System Energy Efficiency" IEEE Transactions on Computer-Aided Design of Intergrated Circuits and Systems, vol. 39, No. 4, 2020, pp. 895-908.

Lien, Y-J, et al., "An Energy-efficient Si-integrated Micro-cooler for High Power and Power-density Computing Applications," 74th Electronic Components and Technology Conference, 2024, pp. 1025-1029.

U.S. Appl. No. 18/129,567, filed Mar. 31, 2023, First Name Inventor: Cyprian Emeka Uzoh, "Embedded Cooling Systems for Device Packages and Methods of Cooling Packaged Devices".

U.S. Appl. No. 18/393,016, filed Dec. 21, 2023, First Name Inventor: Gill Fountain, "Integrated Cooling Assemblies for Advanced Device Packaging and Methods of Manufacturing the Same".

U.S. Appl. No. 18/784,639, filed Jul. 25, 2024, First Name Inventor: Gaius Gillman Fountain, "Fabrication Methods and Structures for Liquid Cooling Channel Chip".

U.S. Appl. No. 18/788,853, filed Jul. 30, 2024, First Name Inventor: Ron Zhang, "Fluid Channel Geometry Optimizations To Improve Cooling Efficiency".

Shamsa et al., "Thermal conductivity of diamond-like carbon films". Applied Physics Letters, vol. 89, No. 16, Oct. 16, 2006, pp. 161921-161921-3.

Walsh, Stephen Michael, "Microjet Impingement Cooling of High Power-Density Electronics," Thesis, submitted May 11, 2018, 93 pages.

Wu, C. J., et al., "Ultra High Power Cooling Solution for 3D-Ics", 2021 Symposium on VLSI Technology, Jun. 2021, 2 pages.

\* cited by examiner

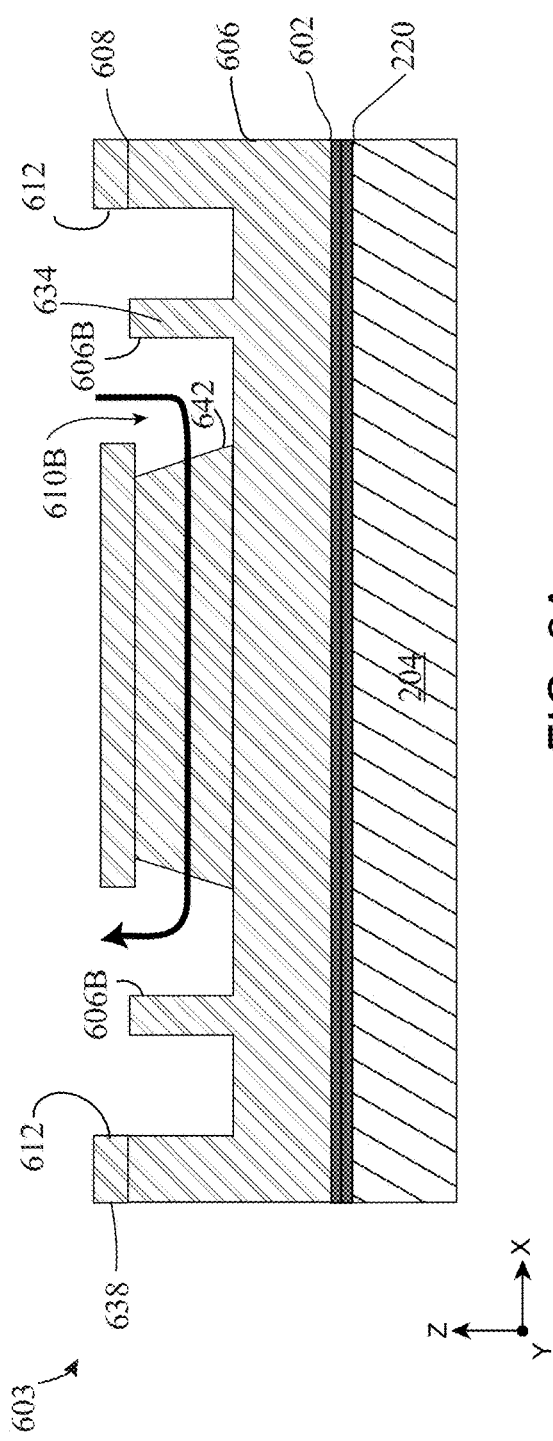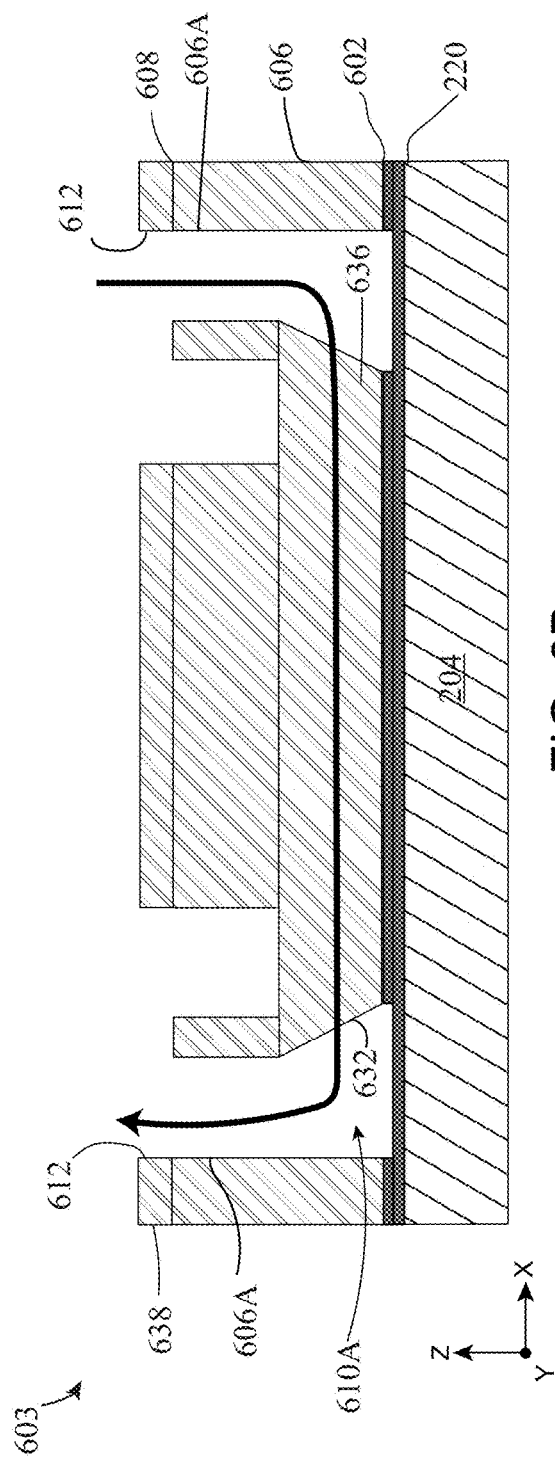

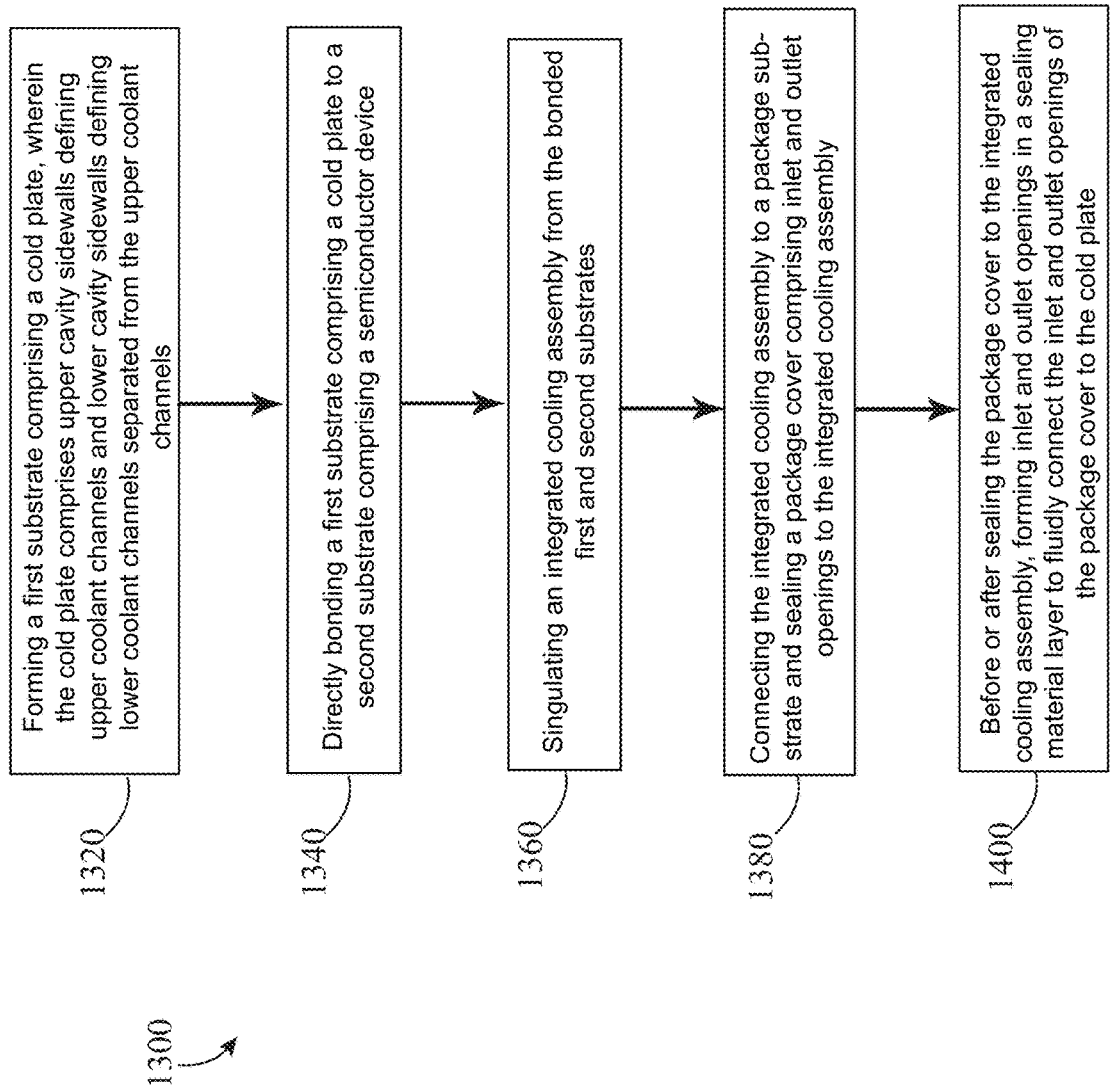

INTEGRATED COOLING ASSEMBLY WITH UPPER AND LOWER CHANNELS

FIELD

The present disclosure relates to advanced packaging for microelectronic devices, and in particular, cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information, communication and technology (ICT) ecosystem could exceed 20% of global electricity use by 2030, with direct electrical consumption by large-scale computing centers accounting for more than one-third of that energy usage. A significant portion of the energy used by such large-scale computing centers is devoted to cooling, since even small increases in operating temperatures can negatively impact the performance of microprocessors, memory devices, and other electronic components. While some of this energy is expended to operate the cooling systems that are directly cooling the chips (e.g., heat spreaders, heat pipes, etc.), energy consumption/costs for indirect cooling can also be quite staggering. Indirect cooling energy costs include, for example, cooling or air conditioning of data center buildings. Data center buildings can house thousands, to tens of thousands or more, of high performance chips in server racks, and each of those high performance chips is a heat source. An uncontrolled ambient temperature in a data center will adversely affect the performance of the individual chips, and the data center system performance as a whole.

Thermal dissipation in high-power density chips (semiconductor devices/die) is also a critical challenge as improvements in chip performance, e.g., through increased gate or transistor density due to advanced processing nodes, evolution of multi-core microprocessors, etc., have resulted in increased power density and a corresponding increase in thermal flux that contributes to elevated chip temperatures. Higher density of transistors also increases the length of metal wiring on the chips, which generates its own additional thermal flux due to Joule heating of these wires due to higher currents. These elevated temperatures are undesirable as they can degrade the chip's operating performance, efficiency, reliability, and amount of remaining life. Cooling systems used to maintain the chip at a desired operating temperature typically remove heat using one or more heat dissipation devices, e.g., thermal spreaders, heat pipes, cold plates, liquid cooled heat pipe systems, thermal-electric coolers, heat sinks, etc. One or more thermal interface materials (TIMs), such as, for example, thermal paste, thermal adhesive, or thermal gap filler, may be used to facilitate heat transfer between the surfaces of a chip and heat dissipation device(s). A thermal interface material is any material that is inserted between two components to enhance the thermal coupling therebetween. Unfortunately, the combined thermal resistance of (i) the interfacial boundary regions between one or more TIMs and the chip and/or the heat dissipation device(s), and (ii) the thermal interface material itself can inhibit heat transfer from the chip to the heat dissipation devices, undesirably reducing the cooling efficiency of the cooling system.

Generally speaking, there are multiple components between the heat dissipating sources (i.e., active circuitry) in the chips and the heat dissipation devices, each of which contributes to the system thermal resistance cumulatively along the heat transfer paths and raises chip junction temperatures from the ambient. Such cooling systems can suffer from reduced cooling efficiency due to the design and manufacture of system components.

Accordingly, there exists a need in the art for improved energy-efficient cooling systems, by reducing system thermal resistance, and methods of manufacturing the same.

SUMMARY

Embodiments herein provide integrated cooling assemblies embedded in advanced device packages. Advantageously, the integrated cooling assemblies improve the efficiency of thermal cooling of a semiconductor device by providing a cold plate with upper coolant channels and lower coolant channels. The upper and lower coolant channels form a cold plate having a two layered cooling mechanism.

A first general aspect includes an integrated cooling assembly including a semiconductor device and a cold plate attached to a backside of the semiconductor device. The cold plate includes an upper portion disposed vertically adjacent to the backside of the semiconductor device, and a lower portion disposed between the upper portion of the cold plate and the backside of the semiconductor device. The upper portion includes upper coolant channels defined by upper cavity sidewalls. The lower portion includes lower coolant channels defined by lower cavity sidewalls. The upper cavity sidewalls extend downwardly into regions between adjacent lower coolant channels. The lower cavity sidewalls extend upwardly into regions between adjacent upper coolant channels.

Implementations of the integrated cooling assembly may include one or more of the following features. The cold plate may include a lower side facing the backside of the semiconductor device and an upper side opposite the lower side. The lower cavity sidewalls may extend upwardly into the lower portion from the lower side of the cold plate to form the lower coolant channels. The upper cavity sidewalls may extend downwardly into the upper portion from the upper side of the cold plate to form the upper coolant channels.

Implementations of the integrated cooling assembly may also include one or more of the following features. The upper coolant channels may be separated from the lower coolant channels by the upper cavity sidewalls and the lower cavity sidewalls.

Implementations of the integrated cooling assembly may also include one or more of the following features. The cold plate may include a channel cover disposed on the upper portion of the cold plate to fluidly seal the upper coolant channels. The upper coolant channels may be horizontally offset from the lower coolant channels.

A second general aspect includes a package device including the integrated cooling assembly according to the first general aspect. The package device may include a package substrate. The integrated cooling assembly may be attached to the package substrate. A package cover may be disposed over the integrated cooling assembly. The package cover may include an inlet opening and an outlet opening disposed therethrough. The upper coolant channels and the lower coolant channels may be in fluid communication with the inlet opening and the outlet opening of the package cover.

A third general aspect includes a method. In one embodiment, the method includes forming a first substrate comprising a cold plate according to the first general aspect. The method further includes directly bonding the cold plate to a second substrate comprising a semiconductor device.

BRIEF DESCRIPTION OF THE DRAWINGS

The above and other objects and advantages of the disclosure will be apparent upon consideration of the following detailed description, taken in conjunction with the accompanying drawings, in which:

FIG. 6A is a schematic sectional view in the X-Z plane of another integrated cooling assembly, in accordance with embodiments of the present disclosure;

FIG. 6B is another schematic sectional view in the X-Z plane of the integrated cooling assembly illustrated in FIG. 6A, in accordance with embodiments of the present disclosure;

FIG. 13 shows a method that can be used to manufacture the integrated cooling assembly described herein.

Figure 1:
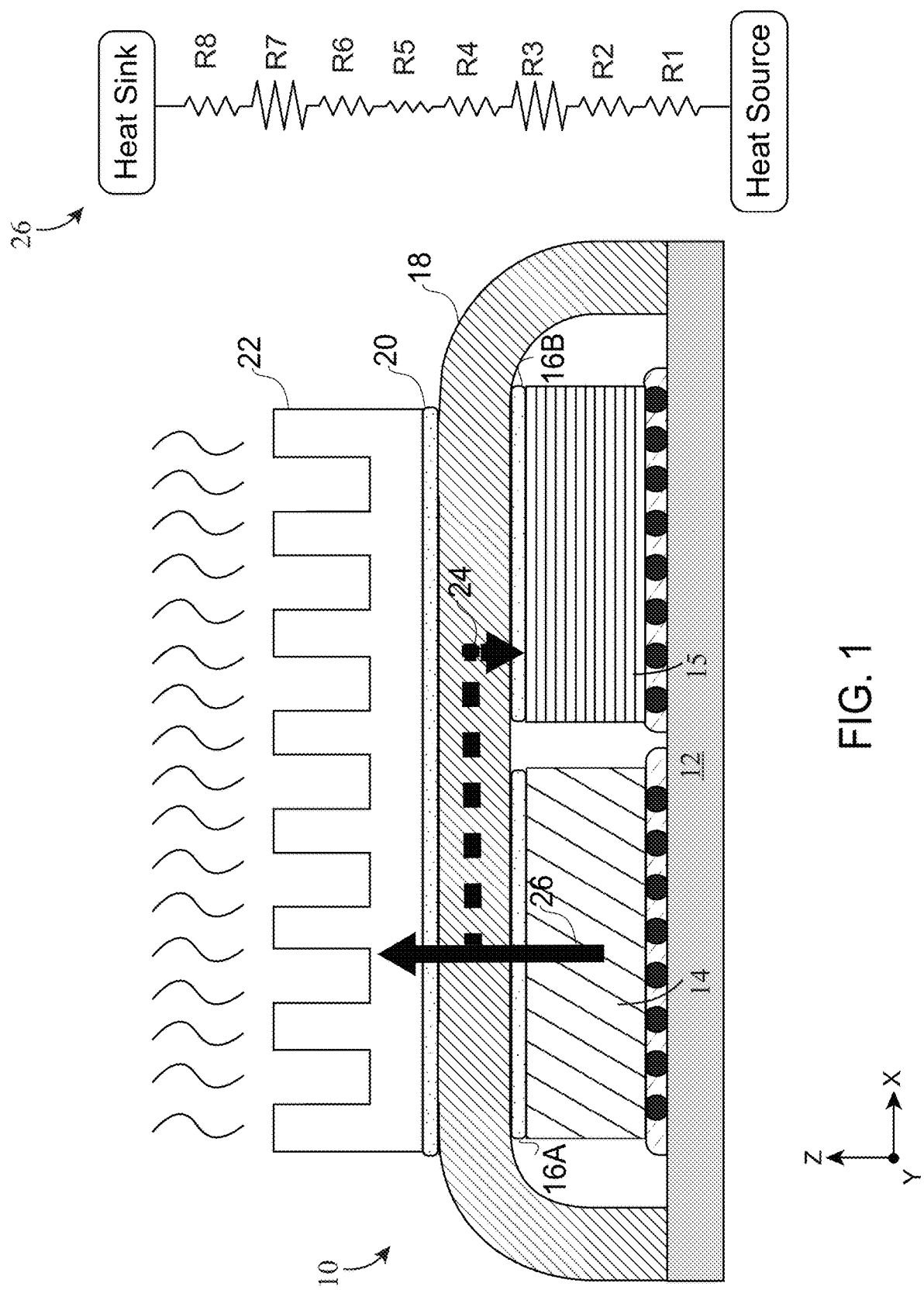
FIG. 1 illustrates a device package with an external heat sink.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed or mounted. The term "substrate" also includes semiconductor substrates that provide a supporting material upon which elements of a semiconductor device are fabricated or attached, and any material layers, features, and/or electronic devices formed thereon, therein, or therethrough. Examples of substrate material that may be used in applications that generate high thermal density include, but are not limited to, Si, GaN, SiC, InP, GaP, InGaN, AlGaInP, AlGaAs, etc.

As described below, the semiconductor substrates herein generally have a "device side" e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that forms the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active sides" and "non-active sides" are also used to describe surfaces of material layers or features formed on, in, or through the semiconductor substrate, whether or not the material layers or features are ultimately present in the fabricated or assembled device. For example, in some instances, the term "active side" is used to indicate a surface of a substrate that will in the future, but does not yet, include semiconductor device elements.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," "top," "bottom" and the like are generally made with reference to the X, Y, and Z directions set forth by X, Y and Z axes in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," and the like, either alone or in combination with a spatially relevant term, include both relationships with intervening elements and direct relationships where there are no intervening elements. Furthermore, the term "horizontal" is generally made with reference to the X-axis direction and the Y-axis direction set forth in the drawings. The term "vertical" is generally made with reference to the Z-axis direction set forth in the drawings.

Various embodiments disclosed herein include bonded structures in which two or more elements are directly bonded to one another without an intervening adhesive (referred to herein as "direct bonding" or "directly bonded"). The resultant bonds formed by this technique may be described as "direct bonds". In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. As discussed in more detail below, the process of direct bonding (e.g., direct dielectric bonding) provides a reduction of thermal resistance between a semiconductor device and a cold plate. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term "hybrid bonding" refers to a species of direct bonding having both i) at least one (first) nonconductive feature directly bonded to another (second) nonconductive feature, and ii) at least one (first) conductive feature directly bonded to another (second) conductive feature, without any intervening adhesive or solder. The resultant bonds formed by this technique may be described as "hybrid bonds" and/or "direct hybrid bonds". In some hybrid bonding embodiments, there are many first conductive features, each directly bonded to a second conductive feature, without any intervening adhesive or solder. In some embodiments, nonconductive features on the first element are directly bond to nonconductive features of the second element at room temperature without any intervening adhesive, which is followed by direct bonding of conductive features of the first element to conductive features of the second element via annealing at slightly higher temperatures (e.g., >100° C., >200° C., >250° C., >300° C., etc.), wherein the annealing causes the conductive features to expand faster than the non-conductive features and to bond together.

Unless otherwise noted, the terms "cooling assembly" and "integrated cooling assembly" generally refer to a semiconductor device and a cold plate attached to the semiconductor device. Typically, the cold plate is formed with recessed surfaces that define one or more fluid cavities (e.g., coolant chamber volume(s) or coolant channel(s)) between the cold plate and the semiconductor device. In embodiments where the cold plate is formed with plural fluid cavities, each fluid cavity may be defined by cavity dividers and/or sidewalls of the cold plate. For example, cavity dividers may be spaced apart from each other and extend laterally between opposing cold plate sidewalls (e.g., in one direction between a first pair of opposing cold plate sidewalls, or in two directions between orthogonal pairs of opposing cold plate sidewalls). The cavity dividers and the cold plate sidewalls may collectively define adjacent fluid cavities therebetween. While it is preferred that the cold plate is formed of a material whose coefficient of linear thermal expansion (CTE) is the same as or similar to the bulk material of the semiconductor device, in some embodiments the cold plate may comprise one or more materials such as: polymer, copper, aluminum, silicon, glass, or ceramic, for example.

The cold plate may be attached to the semiconductor device by use of an adhesive layer or by direct bonding or hybrid bonding. Direct bonding may include direct dielectric bonding techniques as described herein, and may give rise to direct dielectric bonds. Hybrid bonding may include hybrid bonding techniques as described herein, and may give rise to direct hybrid bonds. For example, the cold plate may include material layers and/or metal features that facilitate direct bonding or hybrid bonding with the semiconductor device. In some embodiments, the backside of the semiconductor device is beneficially directly exposed to coolant fluids flowing through the integrated cooling assembly, thus providing for direct heat transfer therebetween. It will be understood that "coolant fluid" may alternatively be referred to as "cooling fluid". Unless otherwise noted, the integrated cooling assemblies described herein may be used with any desired fluid, e.g., liquid, gas, and/or vapor-phase coolants, such as water, glycol, etc. In some embodiments, the coolant fluid(s) may contain additives to enhance the conductivity of the coolant fluid(s) within the integrated cooling assemblies. The additives may comprise, for example, nanoparticles of various types, such as carbon nanotubes, graphene, and/or metal oxides. The concentration of these nanoparticles within the coolant fluid may be less than 1%, less than 0.2%, or less than 0.05%. The coolant fluids may also contain a small amount of glycol or glycols (e.g., propylene glycol, ethylene glycol, etc.) to reduce frictional shear stress and drag coefficient in the coolant fluid(s) within the integrated cooling assembly. In some embodiments the coolant fluid may contain entirely glycol or glycols.

Exemplary fluids available for use in the various thermal solution embodiments include: water (either purified or deionized), a glycol (e.g., ethylene glycol, propylene glycol), glycols mixed with water (e.g., ethylene glycol mixed with water (EGW) or propylene glycol mixed with water (PGW)), dielectric fluids (e.g. fluorocarbons, polyalphaolefin (PAO), isoparaffins, synthetic esters, or very high viscosity index (VHVI) oils), or mineral oils. Additionally, depending upon design and operating conditions, these fluids may be used in single-phase liquid, single-phase vapor, two-phase liquid/vapor or two-phase solid/liquid. By adjusting the fluid selection and the relative fluid concentrations in the fluid mixtures, it is possible to alter the thermohydraulic and heat transfer properties by altering the temperatures where phase change occurs, enabling meeting design temperature and pressure conditions for the component being cooled or warmed and the thermal solution being deployed. Additionally, different combinations of the fluid phases may be employed in various hybrid configurations to meet the particular cooling or warming needs of a respective implementation and still be within the scope of the contemplated embodiments.

Additionally, in some embodiments part or all the cooling is provided by gases. Exemplary gases include atmospheric air and/or one or more inert gases such as nitrogen. Atmospheric air may be taken to mean the mixture of different gases in Earth's atmosphere made up of about 78% nitrogen and 21% oxygen.

Depending on the design needs of a thermal solution system using the disclosed embodiments, engineered dielectric coolant fluids may be used. As used herein, a dielectric coolant fluid is a fluid that is thermally conductive but not electrically conductive. Some examples of dielectric fluids used for cooling semiconductors include: 3M™ Fluorinert™ Liquid FC-40-A non-flammable, dielectric fluid that can be used in direct contact with live electronics; 3M™ Novec™ Engineered Fluids—A non-flammable, dielectric fluid that can be used in direct contact with live electronics; Galden® PFPE (perfluoropolyether) products used as heat transfer fluids; EnSolv Fluoro HTF—A solvent with a high boiling point and low pour point that can be used for semiconductor wafer cooling. It is understood that in the selection of the coolant fluid, system design aspects such as operating temperatures and pressures, fluid flow rates, fluid viscosity, and other properties will require evaluation when selecting the appropriate coolant fluid.

In some embodiments, the coolant fluids may contain microparticles and/or nano-particle additives to enhance the conductivity of the coolant fluid within the integrated cooling assemblies. Nanofluids are engineered fluids prepared by suspending the nano-sized (1-100 nm) particles of metals/non-metals and their oxide(s) with a base/conventional fluid. The suspension of high thermal conductivity metals/non-metals and their oxides nano-particles enhances the thermal conductivity and heat transfer ability, etc. of the base fluid. The additives to the underlying coolant fluid may comprise for example, nano-particles of carbon nanotube, nano-particles of graphene, or nano-particles of metal oxides. When the coolant fluid contains microparticles, the microparticles are typically 10 microns or less in diameter. Silicon oxide microparticles may be used.

The volume concentration of these micro or nano-particles within the coolant fluid may be less than 1%, less than 0.2%, or less than 0.05%. Depending upon the liquid and micro/nano-particle type chosen for the coolant fluid, higher volume concentrations of 10% or less, 5% or less, or 2% or less may be used. The coolant fluids may also contain small amounts of glycol or glycols (e.g. propylene glycol, ethylene glycol etc.) to reduce frictional shear stress and drag coefficient in the coolant fluid within the integrated cooling assembly. The availability of different base fluids (e.g., water, ethylene glycol, mineral or other stable oils, etc.) and different nanomaterials provide a variety of nanomaterial options for nanofluid solutions to be used in the various embodiments. These nanomaterial option groups such as aforementioned metals (e.g., Cu, Ag, Fe, Au, etc.), metal oxides (e.g., $TiO_2$, $Al_2O_3$, CuO, etc.), carbons (e.g. CNTS, graphene, diamond, graphite . . . , etc.), or a mixture of different types of nanomaterials. Metal nano-particles (Cu, Ag, Au . . . ), metal oxide nano-particles ($Al_2O_3$, $TiO_2$, CuO), and carbon-based nano-particles are commonly employed elements. Silicon oxide nano-particles may also be used. Using coolant fluids with micro and/or nano-particles when practicing the various embodiments disclosed herein can result in increased heat removal efficiencies and effectiveness.

The fluid control design aspects of specific embodiments may require the nanofluids to be magnetic to facilitate either movement or cessation of movement of the fluids within the semiconductor structures. Magnetic nanofluids (MNFs) are suspensions of a non-magnetic base fluid and magnetic nano-particles. Magnetic nano-particles may be coated with surfactant layers such as oleic acid to reduce particle agglomeration and/or settling. Magnetic nano-particles used in MNFs are usually made of metal materials (ferromagnetic materials) such as iron, nickel, cobalt, as well as their oxides such as spinel-type ferrites, magnetite ($Fe_3O_4$), and so forth. The magnetic nano-particles used in MNFs typically range in size from about 1 to 100 nanometers (nm).

This disclosure describes embodiments involving the architecture of system and component elements that can be employed to provide for the cooling of semiconductor components, packaging, and boards. However, those skilled in the art will appreciate the disclosed components and arrangements can be deployed and used in scenarios where component heat up or thermal warm up is desired for a component that is currently outside the low end of the desired operational range. Components that are outside the low end of their operational range can, if started in a cold environment, experience thermal warping or cracking up to and including thermal overexpansion and contact separation that may impair the successful operation of the system. Therefore, in these scenarios, the architectures and embodiments disclosed herein can be used where the indirect thermal solutions supporting them are repurposed or operated in a hybrid configuration to provide warming fluids or heat transfer media to accomplish the warm-up or heat-up scenario. These scenarios are controlled by systems not shown here to bring temperatures up at a speed or timing that enables the materials to avoid the excessive thermal expansion or unequal thermal expansion that may occur among the materials of the semiconductor or packaging being serviced by the thermal solution. Once the component or packaging is brought up into the normal operating range, it can be safely started and brought to a useful operational state.

Considering the warm-up or heat-up embodiments introduced above, the balance of this disclosure and terms used should be viewed in a light that also considers the design option for such warm-up or heat-up. Thus, where terms such as cooling channel, cooling chamber volume, and cooling port are used, for example, such terms could also be considered as a thermal control channel, a thermal control volume, or a thermal control port, respectively. A person of skill would understand that heat flux or heat transfer would go in a different direction, but the design concepts are similar and can be successfully employed in the various embodiments.

In some embodiments, a cooling channel is a liquid cooling channel, and a liquid may flow through the liquid cooling channel. In some embodiments, the liquid may comprise a water and/or glycol (e.g., propylene glycol, ethylene glycol, and mixtures thereof).

As described below, coolant fluid flowing through a cold plate may be used to control the temperature of semiconductor devices. The fluid flowing across the surface of the semiconductor device absorbs heat and conducts heat away from the semiconductor device.

FIG. 1 is a schematic side view of a device package 10 and a heat sink 22 attached to the device package 10. The device package 10 typically includes a package substrate 12, a first device 14, a device stack 15, a heat spreader 18, and first TIM layers 16A, 16B thermally coupling the first device 14 and the device stack 15 to the heat spreader 18. The device package 10 is thermally coupled to the heat sink 22 through a second TIM layer 20. The TIM layers 16A, 16B, 20 facilitate thermal contact between components in the device package 10 and between the device package 10 and the heat sink 22.

As heat flux density increases with increasing power density in advanced semiconductor devices, the cumulative thermal resistance of the system illustrated in FIG. 1 is increasingly problematic as heat cannot be dissipated quickly enough to allow semiconductor devices to run at optimal power. Consequently, the energy efficiency of semiconductor devices is reduced. Furthermore, heat is transferred between semiconductor devices within the device package 10, as shown with heat transfer path 24 (illustrated as a dashed line), where heat may be undesirably transferred from the first device 14 having a high heat flux, such as a central processing unit (CPU) or a graphical processing unit (GPU), to the device stack 15 having low heat flux, such as memory, through the heat spreader 18.

For example, as shown in FIG. 1, each device package component and the respective interfacial boundaries therebetween have a corresponding thermal resistance that forms heat transfer path 26 (illustrated by arrow 26 in FIG. 1). The right-hand side of FIG. 1 illustrates the heat transfer path 26 as a series of thermal resistances R1-R8 between a heat source and a heat sink. Here, R1 is the thermal resistance of the bulk semiconductor material of the first device 14. R3 and R7 are the thermal resistances of the first TIM layers 16A, 16B and the second TIM layer 20, respectively. R5 is the thermal resistance of the heat spreader 18. R2, R4, R6, and R8 represent the thermal resistance at the interfacial region of the components (e.g., contact resistances). In a typical cooling system, R3 and R7 may account for 80% or more of the cumulative thermal resistance of the heat transfer path 26, and R5 may account for 5% or more. R1 of the first device 14 and R2, R4, R6, and R8 of the interfaces account for the remaining cumulative thermal resistance. Accordingly, embodiments described herein provide for integrated cooling assemblies embedded within a device package. The embedded cooling assemblies shorten the thermal resistance path between a semiconductor device and a heat sink and reduce thermal communication between semiconductor devices disposed in the same device package, such as described in relation to the figures below.

Figure 2A:
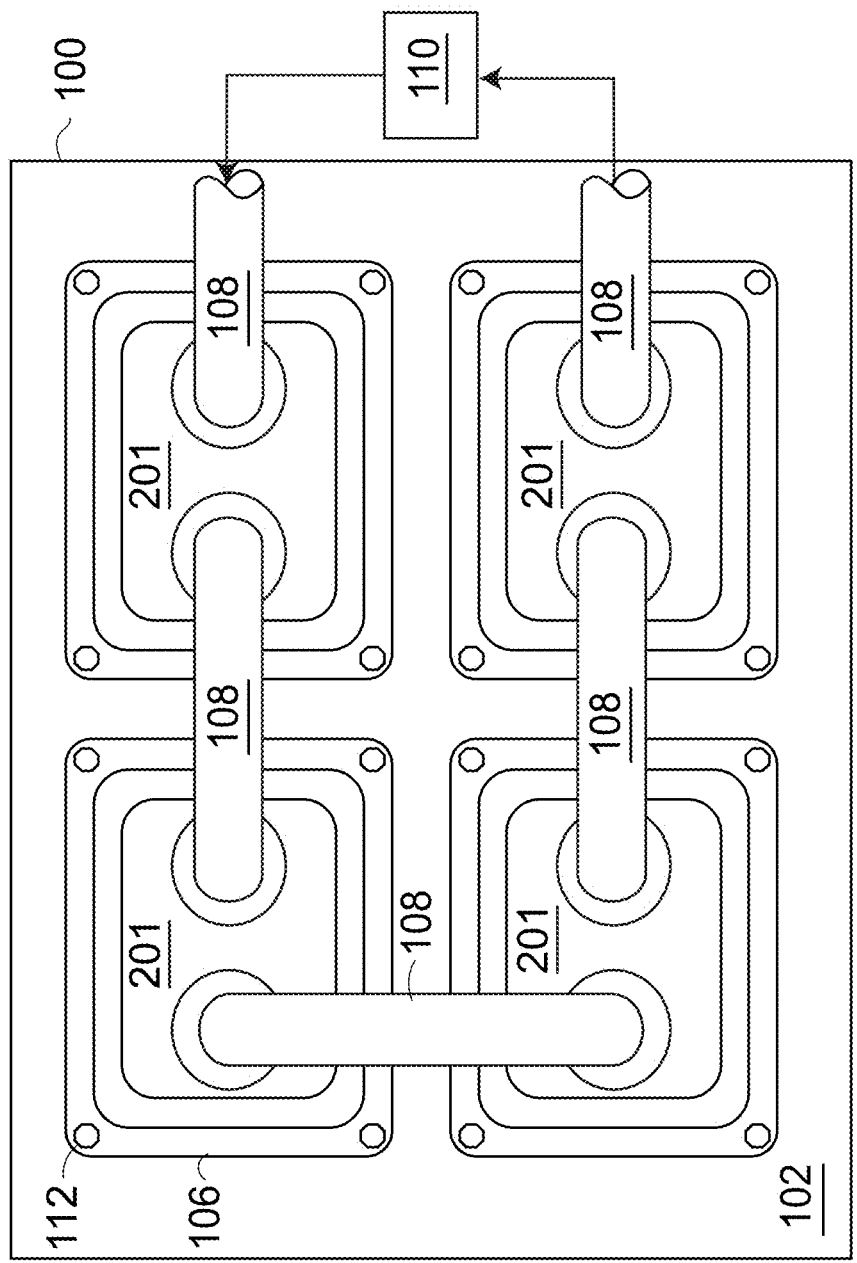
FIG. 2A is a schematic plan view of an example of a system panel, in accordance with embodiments of the present disclosure.

FIG. 2A is a schematic plan view of an example of a system panel 100, in accordance with embodiments of the present disclosure. Generally, the system panel 100 includes a printed circuit board (PCB) 102, a plurality of device packages 201 mounted to the PCB 102, and a plurality of coolant lines 108 fluidly coupling each of the device packages 201 to a coolant source 110. It is contemplated that coolant fluid may be delivered to each of the device packages 201 in any desired fluid phase, e.g., liquid, vapor, gas, or combinations thereof, and may flow out from each device package 201 in the same phase or a different phase. In some embodiments, the coolant fluid is delivered to the device packages 201 and returned therefrom as a liquid, whereby the coolant source 110 may comprise a heat exchanger or chiller to maintain the coolant fluid at a desired temperature. In other embodiments, the coolant fluid may be delivered to the device packages 201 as a liquid, vaporized to a vapor within the device packages 201, and returned to the coolant source 110 as a vapor. In those embodiments, the device packages 201 may be fluidly coupled to the coolant source 110 in parallel, and the coolant source 110 may include or further include a compressor (not shown) for condensing the received vapor to a liquid form.

Figure 2B:
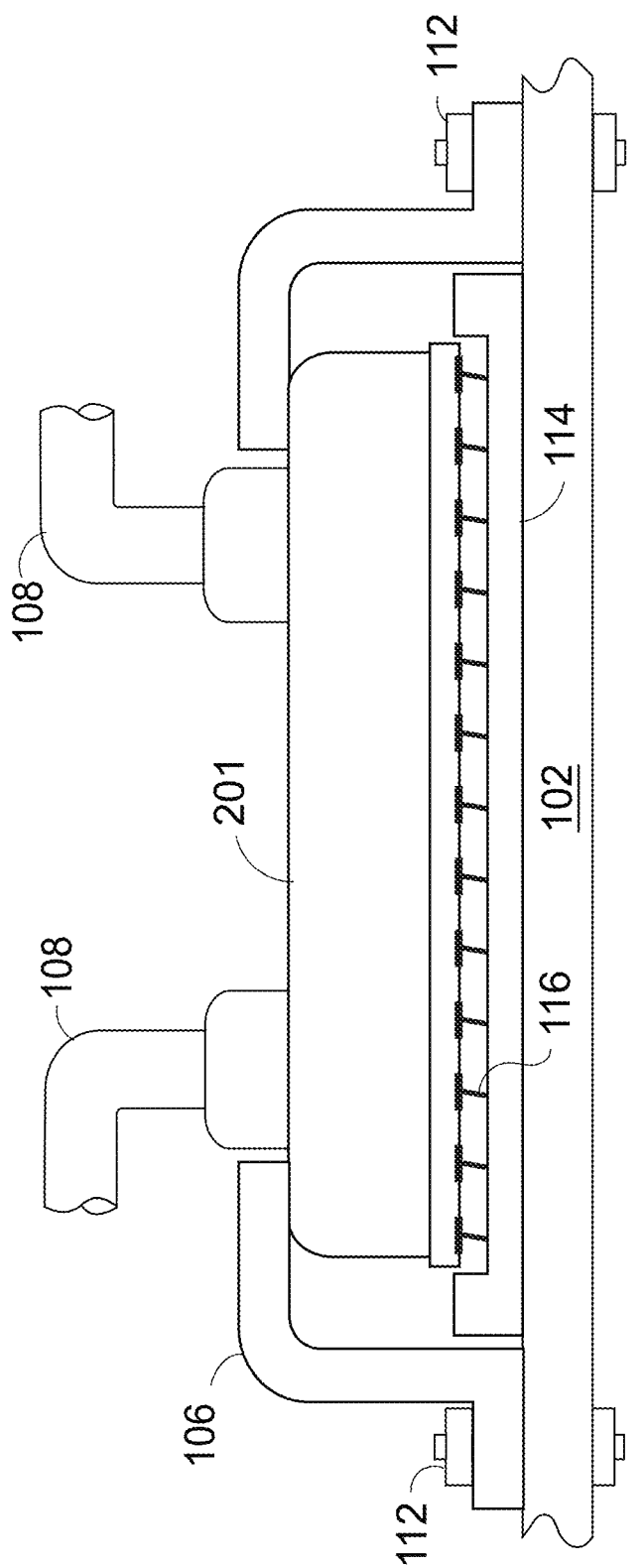
FIG. 2B is a schematic partial side view of a device package mounted on a PCB, in accordance with embodiments of the present disclosure.

FIG. 2B is a schematic partial sectional side view of a portion of the system panel 100 of FIG. 2A. As shown, each device package 201 is fluidly coupled to the plurality of coolant lines 108 and is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, e.g., compression screws, collectively configured to exert a relatively uniform downward force on the upward facing edges of the device package 201. The uniform downward force ensures proper pin contact between the device package 201 and the socket 114.

Figure 2C:
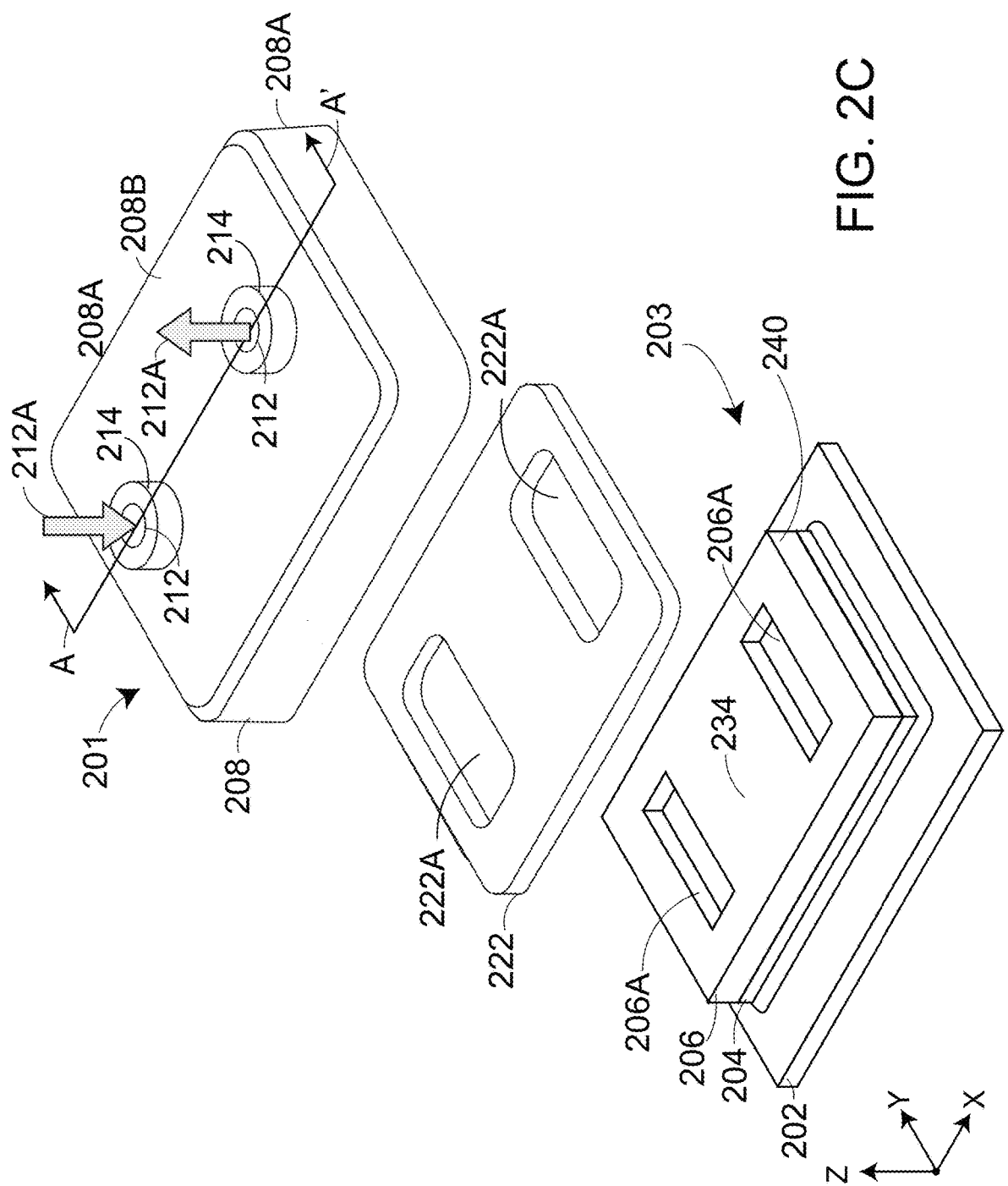
FIG. 2C is a schematic exploded isometric view of the device package in FIG. 2B.

FIG. 2C is a schematic exploded isometric view of an example device package 201, in accordance with embodiments of the present disclosure. Generally, the device package 201 includes a package substrate 202, an integrated cooling assembly 203 disposed on the package substrate 202, and a package cover 208 disposed on a peripheral portion of the package substrate 202. Suitable materials that may be used in the package cover 208 include copper, aluminum, metal alloys, etc. The package cover 208 extends over the integrated cooling assembly 203 so that the integrated cooling assembly 203 is disposed between the package substrate 202 and the package cover 208. The integrated cooling assembly 203 typically includes a semiconductor device 204 and a cold plate 206 bonded to the semiconductor device 204. Although the lateral dimensions (or footprint) of the cold plate 206 are shown to be the same or similar to the lateral dimensions (or footprint) of the semiconductor device 204, the footprint of the cold plate 206 may be smaller or larger in one or both directions when compared to the footprint of the semiconductor device 204.

As shown, the device package 201 further includes a sealing material layer 222 that forms a coolant fluid impermeable barrier between the package cover 208 and the integrated cooling assembly 203 that prevents leaking of the coolant fluid outside of the cooling assembly and prevents coolant fluid from reaching an active side 218 (discussed below in relation to FIG. 3) of the semiconductor device 204 and causing damage thereto. In some embodiments, the sealing material layer 222 comprises an adhesive material that reliably attaches the package cover 208 to the integrated cooling assembly 203. In some embodiments, the sealing material layer 222 comprises a polymer or epoxy material that extends upwardly from the package substrate 202 to encapsulate and/or surround at least a portion of the semiconductor device 204. In some embodiments, the sealing material layer 222 may also comprise conductive material, e.g., solder. In other embodiments, the sealing material layer 222 is formed from a molding compound, e.g., a thermoset resin, that when polymerized, forms a hermetic seal between the package cover 208 and the cold plate 206. Here, the coolant fluid is delivered to the cold plate 206 through openings 222A disposed through the sealing material layer 222. As shown, the openings 222A are respectively in registration and fluid communication with inlet and outlet openings 212 of the package cover 208 thereabove and inlet and outlet openings 206A in the cold plate 206 therebelow.

It will be understood that the openings are shown in a section view. The openings may have any cross-sectional shape that allows fluid to flow therethrough (e.g., rectangular, square, hexagonal or circular cross-sections). For example, the inlet and outlet openings 206A of the cold plate 206 may form an elongated shape extending from one side of the cold plate 206 to another side of the cold plate 206. For example, the inlet and outlet openings 206A may form any shape having a length greater than a width in the X-Y plane (e.g., a rectangular or a trapezoidal shape). A shape in the X-Y plane of the openings 222A disposed through the sealing material layer 222 may be substantially the same as the shape of the inlet and outlet openings 206A of the cold plate 206 in the same place. Furthermore, it will be understood that references to an opening throughout the present disclosure refer to an opening defined by a sidewall (e.g., opening sidewall), unless otherwise indicated.

In some embodiments, gaps formed between the inside walls of the package cover 208 and the integrated cooling assembly 203 may be filled (partially or completely) with a molding material 223. The molding material 223 may encapsulate the integrates cooling assembly 203 to improve structural stability, for example.

The package substrate 202 can include a rigid material, such as an epoxy or resin-based laminate, that supports the integrated cooling assembly 203 and the package cover 208. The package substrate 202 may include conductive features disposed in or on the rigid material that electrically couples the integrated cooling assembly 203 to a system panel, such as the PCB 102.

Figure 3:
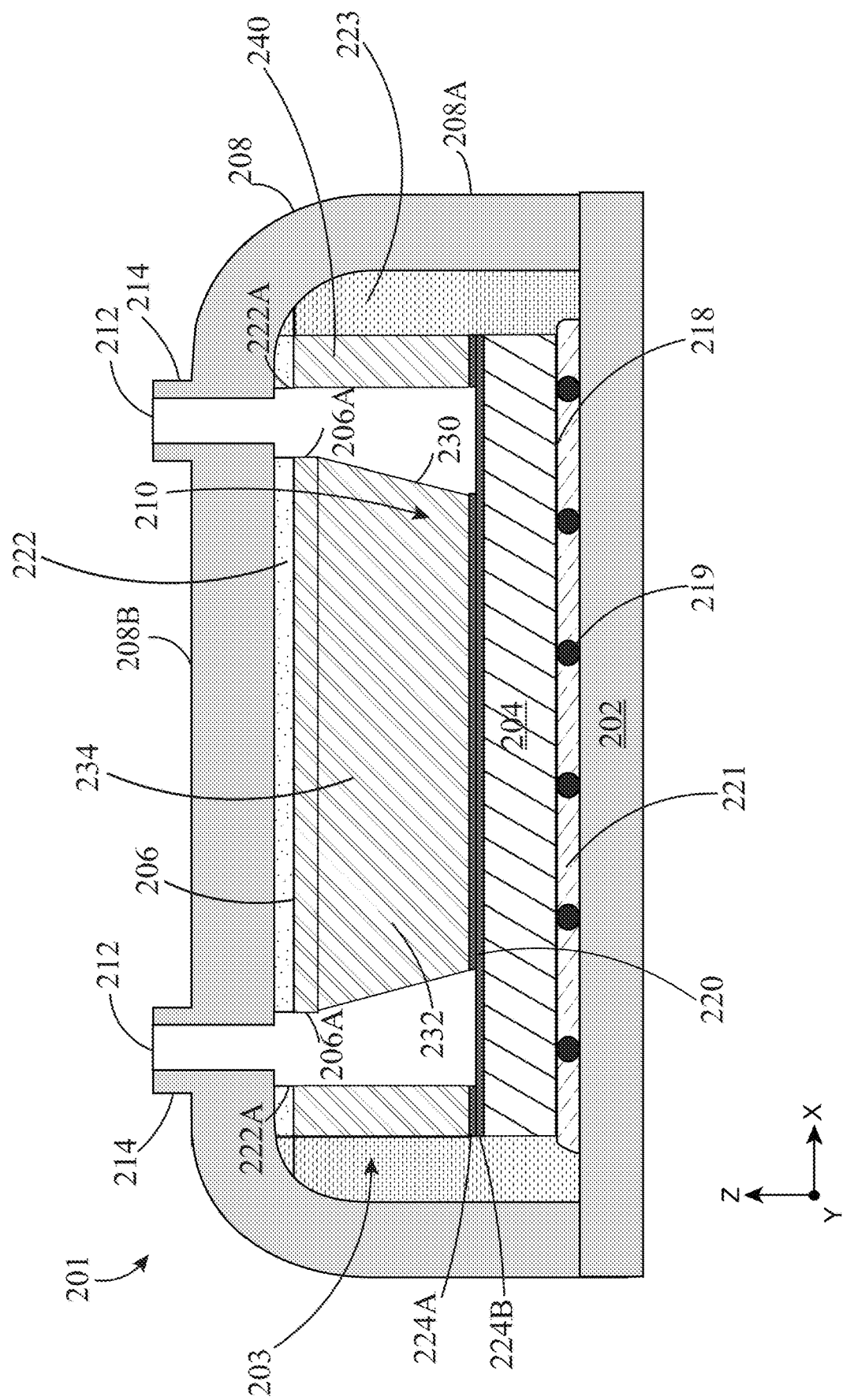
FIG. 3 is a schematic sectional view of an example device package, in accordance with embodiments of the present disclosure, that may be used with the system panel.

FIG. 3 is a schematic sectional view in the X-Z plane of the device package 201 taken along line A-A' of FIG. 2C. As illustrated in FIG. 3, the semiconductor device 204 includes the active side 218 that includes device components, e.g., transistors, resistors, and capacitors, formed thereon or therein, and a non-active side, here the semiconductor device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the semiconductor device 204 and the package substrate 202. The first underfill layer 221 may comprise a cured polymer resin or epoxy, which provides mechanical support to the conductive bumps 219 and protects against thermal fatigue. In some embodiments, the active side 218 may be electrically connected to another package substrate, another active die, or another passive die (e.g., interposer) using hybrid bonding or conductive bumps 219. For example, the package substrate 202 may be a semiconductor substrate, a semiconductor interposer, a glass substrate, a glass interposer, a PCT or a combination thereof. The cold plate 206 may be disposed above the package substrate 202 with the semiconductor device 204 disposed therebetween. For example, the semiconductor device 204 (and the first underfill layer 221) may be disposed between the cold plate 206 and the package substrate 202. In some embodiments, the cold plate 206 may be disposed directly on the package substrate 202.

Figure 4:
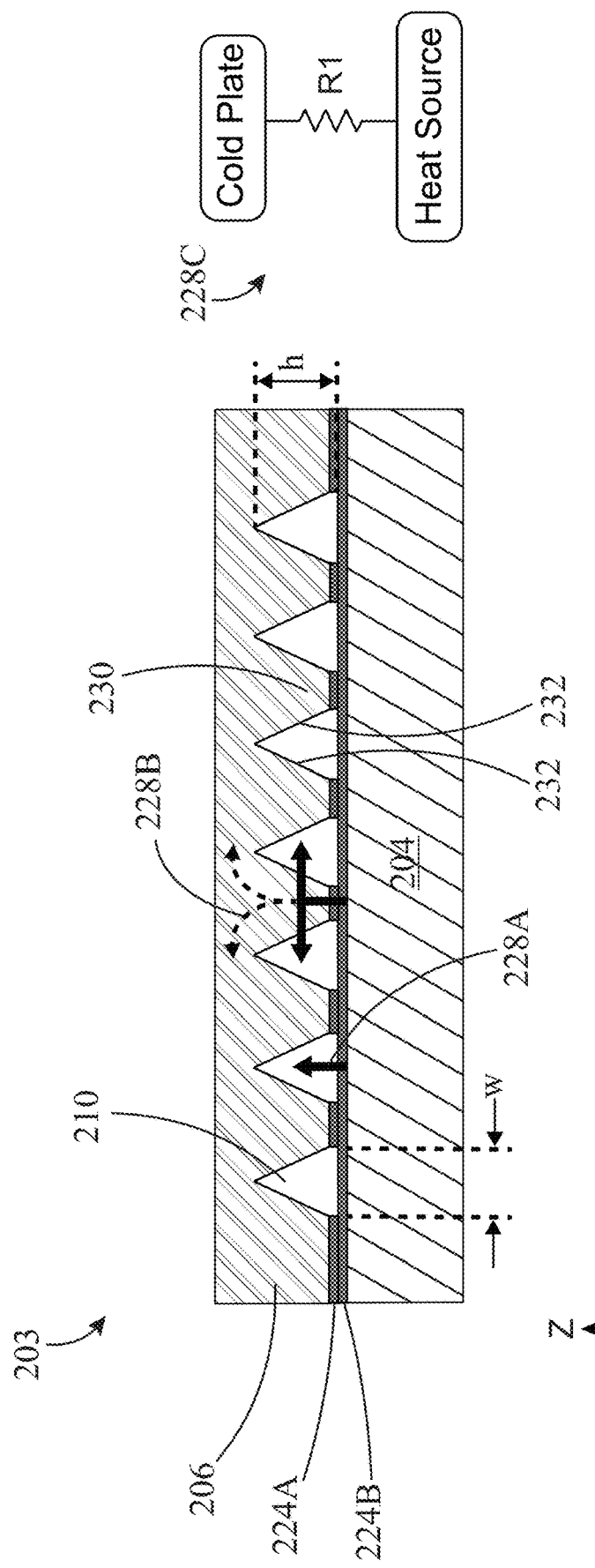
FIG. 4 is a schematic sectional view of an integrated cooling assembly of a device package, in accordance with embodiments of the present disclosure.

Here, the cold plate 206 comprises a upper portion 234 and a sidewall 240 (e.g., a perimeter sidewall defining a perimeter of the cold plate 206) extending downwardly from the upper portion 234 to the backside 220 of the semiconductor device 204. The upper portion 234, the perimeter sidewall 240, and the backside 220 of the semiconductor device 204 collectively define a coolant channel 210 therebetween. The cold plate 206 comprises cavity dividers 230 extending downwardly from the upper portion 234 towards the backside 220 of the semiconductor device 204. The cavity dividers 230 may alternatively be referred to as support features 230, which provide structural support to the integrated cooling assembly 203. The cavity dividers 230 may extend laterally and in parallel between an inlet opening 206A of the cold plate 206 and an outlet opening 206A of the cold plate 206 to define plural coolant channels 210 therebetween. It should be appreciated that, the cold plate 206 may comprise one cavity divider 230 which forms two coolant channels (e.g., one coolant channel on either side of the cavity divider 230) by means of the cavity divider 230 and portions of the perimeter sidewall 240. More specifically, coolant channels 210 may be formed between the cavity divider 230 and a portion of the perimeter sidewall 240 extending parallel to or in the same general direction as the cavity divider 230. Alternatively, in other embodiments, the cold plate 206 may comprise plural cavity dividers 230, for example two cavity dividers, five cavity dividers, or six cavity dividers (as illustrated in FIG. 4). In such examples, the cold plate 206 comprises more than two coolant channels 210, for example three coolant channels, four coolant channels, seven coolant channels, or more, defined between the cavity dividers 230 and/or the cavity divider(s) 230 and the perimeter sidewall 240. In some embodiments, at least one of the cavity dividers 230 may extend discontinuously between the inlet opening 206A and the outlet opening 206A (in the X-axis direction) to form a discontinuous cavity divider. A discontinuous cavity divider may be formed of plural segments between which coolant fluid may flow. The segments of a discontinuous cavity divider may have the same or different lengths in the X-axis direction. One or more segments may form a post.

The cavity dividers 230 comprise cavity sidewalls 232 which form surfaces of corresponding coolant channels 210. In embodiments where plural cavity dividers 230 extend in parallel to each other, cavity sidewalls 232 of adjacent cavity dividers 230 are opposite (e.g., facing) each other. In embodiments comprising a single cavity divider 230, a first cavity sidewall may be opposite (e.g., face) a first portion of the perimeter sidewall 240 extending parallel to and facing the first cavity sidewall. A second cavity sidewall may be opposite (e.g., face) a second portion of the perimeter sidewall 240 extending parallel to and facing the second cavity sidewall. The first portion of the perimeter sidewall 240 may be an opposite side of the cold plate 206 to the second portion of the perimeter sidewall 240. For example, in embodiments where the cold plate 206 is rectangular, first and second opposing sides of the rectangular cold plate 206 form the first and second portions of the perimeter sidewall 240.

The cavity dividers 230 may be continuous cavity dividers which extend continuously (e.g., in the X-axis direction) between the inlet opening 206A and the outlet opening 206A of the cold plate 206.

With reference to FIG. 3, coolant channels 210 may be defined by:
  the backside 220 of the semiconductor device 204, which forms lower coolant channel surfaces;
  portions of the perimeter sidewall 240 extending in the Y-axis direction, which form end surfaces of the coolant channels 210;
  the cavity sidewalls 232, which form inner surfaces of the coolant channels 210 in the X-axis direction; and
  portions of the perimeter sidewall 240 extending in the X-axis direction, which form outer surfaces of the coolant channels 210 in the X-axis direction.

As shown in FIG. 4 and described in further detail below, the cavity sidewalls 232 can be formed at an acute angle with respect to the backside 220 of the semiconductor device 204 such that upper portions of opposing (e.g., facing) cavity sidewalls 232 meet. Therefore, the cavity sidewalls 232 and the backside 220 of the semiconductor device 204 collectively define a triangular cross-section of the coolant channel 210. However, it will be understood that the coolant channel 210 may be formed with different shaped cross-sections. For example, one or more coolant channels may be formed with trapezoidal, rectangular, or semi-circular cross-section, or a combination thereof.

In some embodiments, the backside 220 of the semiconductor device 204 comprises a corrosion protective layer (not shown). The corrosion protective layer may be a continuous layer disposed across the entire backside 220 of the semiconductor device 204, such that the cold plate 206 is attached thereto. Beneficially, the corrosion protective layer provides a corrosion-resistant barrier layer, thus preventing undesired corrosion of the semiconductor device 204 (e.g., the semiconductor substrate material which might otherwise be in direct contact with coolant fluid flowing through a coolant chamber volume 210).

One or more coolant chamber volumes may include one or more coolant channels. The coolant channels may extend between a single inlet opening and a single outlet opening of the cold plate 206, such that the coolant chamber volume(s) and/or coolant channel(s) share the same inlet and outlet openings. In other embodiments, multiple inlet and/or outlet openings may be coupled to the coolant chamber volume(s).

In embodiments having plural coolant chamber volumes and/or plural coolant channels, each coolant chamber volume and/or coolant channel may be connected between a separate inlet opening and a separate outlet opening. In such embodiments, the coolant fluid may be directed to the separate inlet openings and from the separate outlet openings using a manifold disposed above the openings in the Z-axis direction. In some embodiments, a gasket may be used to seal a gap between the manifold and the cold plate inlet/outlet openings. The gasket may be made of rubber (e.g., neoprene, nitrile, ethylene propylene diene monomer, or silicon rubber) or similar such material. For example, the gasket may be an o-ring. The gasket may be attached between a lower surface of the manifold and an upper surface of the cold plate facing the manifold using an adhesive. The gasket may provide a water tight seal to direct coolant fluid from the manifold into the cold plate inlet/outlet openings while preventing coolant fluid from leaking onto exterior surfaces of the integrated cooling assembly 203. In some embodiments, the manifold is attached to one or more cold plates using one or more corresponding gaskets.

Referring to FIG. 4, a height h in the Z-axis direction of the coolant chamber volume(s) and or coolant channel(s) may be greater than 100 μm, 100 μm-1000 μm, or 100 μm-700 μm. A width w in the Y-axis direction of each coolant channel 210 may be greater than 100 μm, 100 μm-1000 μm, or 100 μm-700 μm. For example, the width w of each coolant channel 210 may be greater than the height h thereof. In some embodiments, the width w of a coolant channel 210 may, at the widest portion, which may be taken as a base of the triangular shape of the coolant chamber channels 210 shown in FIG. 4, range from 0.2 mm to 5 mm. More specifically, the width w of a coolant channel 210 may range from 0.5 to 1.5 mm. The width w of a coolant channel 210 may also be between 1 and 5 mm.

A cross-section of a coolant channel 210 in the Y-Z plane may be wide enough to allow for a pressure drop of 0-20 psi, 3-15 psi, or 4-10 psi.

In some embodiments, preparing a desired surface roughness of the sidewalls of each coolant channel 210 may include depositing an organic layer on a photoresist layer after cold plate features have been etched to form a micromasking layer, such as between 1 to 30 nm. The micromasking layer may be dry etched to form the desired surface roughness, such as between 0.1 to 3.0 nm. Advantageously, providing sidewalls with surface roughness increases the likelihood of fluid being directed towards and contacting the backside 220 of the semiconductor device 204 (e.g., by disrupting a hydrodynamic boundary layer of fluid between the sidewall and the coolant fluid).

With reference to FIG. 3, the cold plate 206 is attached to the backside 220 of the device 204 without the use of an intervening adhesive. For example, the cold plate 206 may be directly bonded to the backside 220 of the device 204, such that the cold plate 206 and the backside 220 of the device 204 are in direct contact. For example, in some embodiments, one or both of the cold plate 206 and the backside 220 of the semiconductor device 204 may comprise a dielectric material layer, e.g., a first dielectric material layer 224A and a second dielectric material layer 224B respectively, and the cold plate 206 is directly bonded to the backside 220 of the semiconductor device 204 through bonds formed between the dielectric material layers 224A, 224B. In some embodiments, one of the cold plate 206 or the backside 220 of the semiconductor device 204 may comprise a thin bonding dielectric layer (e.g., silicon nitride, etc.) and other element(s) may not include any such explicit bonding dielectric layer (or can have only a native oxide layer). The first and second dielectric material layers 224A, 224B may be continuous or non-continuous. For example, the first dielectric material layer 224A may be disposed only on lower surfaces of the cold plate 206 facing the backside 220 of the semiconductor device 204. With reference to FIG. 4, described below, portions of the first dielectric material layer 224A may be disposed only on lower surfaces of the cavity dividers 230 (e.g. support features 230) and the perimeter sidewall 240. Beneficially, directly bonding the cold plate 206 to the semiconductor device 204, as described above, reduces the thermal resistance therebetween and increases the efficiency of heat transfer from the semiconductor device 204 to the cold plate 206. In particular, thermal resistance is reduced by directly bonding lower surfaces of the cavity dividers 230 facing the semiconductor device 204 to the backside 220 of the semiconductor device 204.

FIG. 4 is a schematic sectional view in the Y-Z plane of the integrated cooling assembly 203. In FIG. 4, the cold plate 206 comprises a patterned side that faces towards the semiconductor device 204 and an opposite side that faces towards the package cover 208 (not shown). The patterned side comprises a coolant chamber volume having plural coolant channels 210, which extend laterally (along the X-axis direction in FIG. 4) between the inlet and outlet openings of the cold plate 206. Each coolant channel 210 comprises cavity sidewalls that define a corresponding coolant channel 210. Portions of the cold plate 206 between the cavity sidewalls 232 form the support features 230 (e.g., cavity dividers 230). The support features 230 (e.g., cavity dividers 230) provide structural support to the integrated cooling assembly 203 and disrupt laminar fluid flow (e.g., due to surface roughness of the sidewalls) at the interface of the coolant and the device backside 220, resulting in increased heat transfer therebetween. Furthermore, by introducing plural coolant channels 210 to define separate coolant flow paths, an internal surface area of the cold plate 206 is increased, which further increases the efficiency of heat transfer.

In FIG. 4, arrows 228A and 228B illustrate two different heat transfer paths in the integrated cooling assembly 203. A first heat transfer path illustrated by arrow 228A shows heat generated by the semiconductor device 204 transferring directly from the semiconductor material of the semiconductor device 204 to coolant fluid flowing through the cold plate 206. A second heat transfer path illustrated by arrows 228B shows heat generated by the semiconductor device 204 being transferred from semiconductor material (e.g., silicon material) of the semiconductor device 204 to semiconductor material (e.g., silicon material) of the cold plate 206 structure, propagated throughout the semiconductor material of the cold plate 206 structure (shown as dashed lines), and being transferring into coolant fluid flowing through the cold plate 206. A thermal resistance of the first and second heat transfer paths 228A, 228B is illustrated by heat transfer path 228C, which is shown as thermal resistance R1 between a heat source and a cold plate. Here, R1 is the thermal resistance of the bulk semiconductor material of the semiconductor device 204. It can be seen that the heat transfer path 228C of the integrated cooling assembly 203 is reduced compared to the heat transfer path 26 of the device package 10 of FIG. 1, due to the direct bonding discussed above.

In some embodiments, the cold plate 206 may be attached to the semiconductor device 204 using a hybrid bonding technique, where bonds are formed between the dielectric material layers 224A, 224B and between metal features, such as between first metal pads and second metal pads, disposed in the dielectric material layers 224A, 224B. Advantageously, by using hybrid bonding techniques, interconnections may be formed between the cold plate 206 and the semiconductor device 204 using the first and second metal pads.

Suitable dielectrics that may be used as the dielectric material layers 224A, 224B include silicon oxides, silicon nitrides, silicon oxynitrides, silicon carbon nitrides, metal-oxides, metal-nitrides, silicon carbide, silicon oxycarbides, silicon oxycarbonitride, diamond-like carbon (DLC), or combinations thereof. In some embodiments, one or both of the dielectric material layers 224A, 224B are formed of an inorganic dielectric material, e.g., a dielectric material substantially free of organic polymers. Typically, one or both of the dielectric layers are deposited to a thickness greater than the thickness of a native oxide, such as about 1 nanometer (nm) or more, 5 nm or more, 10 nm or more, 50 nm or more, or 100 nm or more. In some embodiments, one or both of the layers are deposited to a thickness of 3 micrometers or less, 1 micrometer or less, 500 nm or less, such as 100 nm or less, or 50 nm or less. The dielectric layer material and thickness may be optimized for lower thermal resistance between the semiconductor device and the cold plate.

The cold plate 206 may be formed of any suitable material that has sufficient structural strength to withstand the desired pressures of coolant flowing into the coolant chamber volume 210. For example, the cold plate 206 may be formed of semiconductor material like silicon or other materials like glass. In other examples, the cold plate 206 may be formed of a material selected from a group comprising polymers, metals, ceramics, or composites thereof. In some embodiments, the cold plate 206 may be formed of stainless steel (e.g., from a stainless steel metal sheet) or a sapphire plate.

In some embodiments, the cold plate 206 may be formed of a bulk material having a substantially similar CTE to the bulk material of the substrate 202 and/or the semiconductor device 204, where the CTE is a fractional change in length of the material (in the X-Y plane) per degree of temperature change. In some embodiments, the CTEs of the cold plate 206, the substrate 202, and/or the semiconductor device 204 are matched so that the CTE of the substrate 202 and/or the semiconductor device 204 is within about +/−20% or less of the CTE of the cold plate 206, such as within +/−15% or less, within +/−10% or less, or within about +/−5% or less when measured across a desired temperature range. In some embodiments, the CTEs are matched across a temperature range from about −60° C. to about 100° C. or from about −60° C. to about 175° C. In one example embodiment, the matched CTE materials each include silicon.

In some embodiments, the cold plate 206 may be formed of a material having a substantially different CTE from the semiconductor device 204, e.g., a CTE mismatched material. In such embodiments, the cold plate 206 may be attached to the semiconductor device 204 by a compliant adhesive layer (not shown) or a molding material that absorbs the difference in expansion between the cold plate 206 and the semiconductor device 204 across repeated thermal cycles.

The package cover 208 shown in FIGS. 2C and 3 generally comprises one or more vertical or sloped sidewall portions 208A and a lateral portion 208B that spans and connects the sidewall portions 208A. The sidewall portions 208A may extend upwardly from a peripheral surface of the package substrate 202 to surround the device 204 and the cold plate 206 disposed thereon. The lateral portion 208B may be disposed over the cold plate 206 and is typically spaced apart from the cold plate 206 by a gap corresponding to the thickness of the sealing material layer 222. The sealing material may be an adhesive or a gasket. In some embodiments, instead of or as well as the sealing material layer 222, a gasket may be used to seal a gap between the package cover 208 and the cold plate inlet/outlet openings. The gasket may be made of rubber (e.g., neoprene, nitrile, ethylene propylene diene monomer, or silicon rubber) or similar such material. For example, the gasket may be an o-ring. The gasket may be attached between a lower surface of the package cover 208 and an upper surface of the cold plate facing the package cover 208 using an adhesive. The gasket may provide a water tight seal to direct coolant fluid from the package cover 208 into the cold plate inlet/outlet openings while preventing coolant fluid from leaking onto exterior surfaces of the integrated cooling assembly 203. In some embodiments, the package cover 208 is attached to one or more cold plates using one or more corresponding gaskets.

Coolant is circulated through the coolant channels 210 through the inlet and outlet openings 212 of the package cover 208 formed through the lateral portion 208B. The inlet and outlet openings 206A of the cold plate 206 may be in fluid communication with the inlet and outlet openings 212 of the package cover 208 through the inlet and outlet openings 222A formed in the sealing material layer 222 disposed therebetween. In certain embodiments, coolant lines 108 (FIGS. 2A-2B) may be attached to the device package 201 by use of connector features formed in the package cover 208, such as threads formed in the sidewalls of the inlet and outlet openings 212 of the package cover 208 and/or protruding features 214 that surround the inlet and outlet openings 212 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the cold plate 206 and the semiconductor device 204 therebelow. In some embodiments, the package cover 208 is formed of a thermally conductive metal, such as aluminum or copper. In such embodiments, the package cover 208 functions as a heat spreader that redistributes heat from one or more electronic components of the semiconductor device 204. In some embodiments, the package cover 208 and/or a manifold (such as the manifold discussed above) may consist of or comprise a thermally insulating material or materials. In such embodiments, the package cover 208 and/or the manifold may function as a thermal insulator to retain heat or cold. In some embodiments, the package cover 208 and/or the manifold may be insulating to minimize or reduce the flow of thermal energy (e.g., thermal flux) between components (e.g., semiconductor devices, semiconductor device stacks, device packages, etc.). For example, the package cover 208 and/or the manifold may minimize or reduce the flow of thermal energy between a first semiconductor device and a second semiconductor device. In another example, the package cover 208 and/or the manifold may minimize or reduce the flow of thermal energy between a first semiconductor device stack and a second semiconductor device stack. In another example, the package cover 208 and/or the manifold may minimize or reduce the flow of thermal energy between a first device package and a second device package. In another example, the package cover 208 and/or the manifold may minimize or reduce the flow of thermal energy between a semiconductor device and a semiconductor device stack. In another example, the package cover 208 and/or the manifold may minimize or reduce the flow of thermal energy between a semiconductor device of a device package and a second device package.

It should be noted that the direction in which the coolant fluid flows through the cold plate 206 may be controlled depending on the relative locations of the inlet and outlet openings. For example, the coolant fluid may flow from left to right in the device package 201 of FIG. 3 when the inlet openings 212, 222A, 206A of the package cover 208, the sealing material layer 222, and the cold plate 206, respectively, are located on the left-hand side of the device package 201 and the outlet openings 212, 222A, 206A of the package cover 208, the sealing material layer 222, and the cold plate 206, respectively, are located on the right-hand side of the device package 201. Alternatively, the coolant fluid may flow from right to left in the device package 201 illustrated in FIG. 3 when the outlet openings 212, 222A, 206A of the package cover 208, the sealing material layer 222, and the cold plate 206 are located on the left-hand side of the device package 201 and the inlet openings 212, 222A, 206A of the package cover 208, the sealing material layer 222, and the cold plate 206 are located on the right-hand side of the device package 201. Although only one set of inlet and outlet openings is shown and described here, additional inlet and outlet openings may also be provided at various locations on the package cover 208, the sealing material layer 222, and the cold plate 206.

An example flow path of the coolant fluid through the coolant channels 210 may be as follows:

1. Coolant fluid enters the coolant chamber volume 210 through the inlet openings 212, 222A, and 206A.

2. Coolant fluid flows across the inside surfaces of the cold plate 206 and absorbs heat generated by the semiconductor device 204, which has dissipated into the cold plate 206 structure. The coolant fluid may also flow directly across the backside 220 of the semiconductor device 204 to absorb heat energy directly from the semiconductor device 204. The coolant chamber volume 210 may additionally have various channels formed to direct the coolant fluid flow from inlet opening(s) to outlet opening(s) and facilitate heat extraction from the semiconductor device 204 by the coolant fluid. In some embodiments, the coolant fluid may be in direct contact with the backside 220 of the semiconductor device 204 or via one or more substrate or layers between the coolant fluid or backside 220 of the semiconductor device 204.

3. Coolant fluid exits the coolant channels 210 through outlet openings 212, 222A, and 206A.

It will be understood from the above flow path that heat is extracted without introducing an unnecessary thermal resistance (e.g., a TIM disposed between the backside 220 of the semiconductor device 204 and the cold plate 206) between the backside 220 of the semiconductor device 204 and the cold plate 206.

Figure 5:
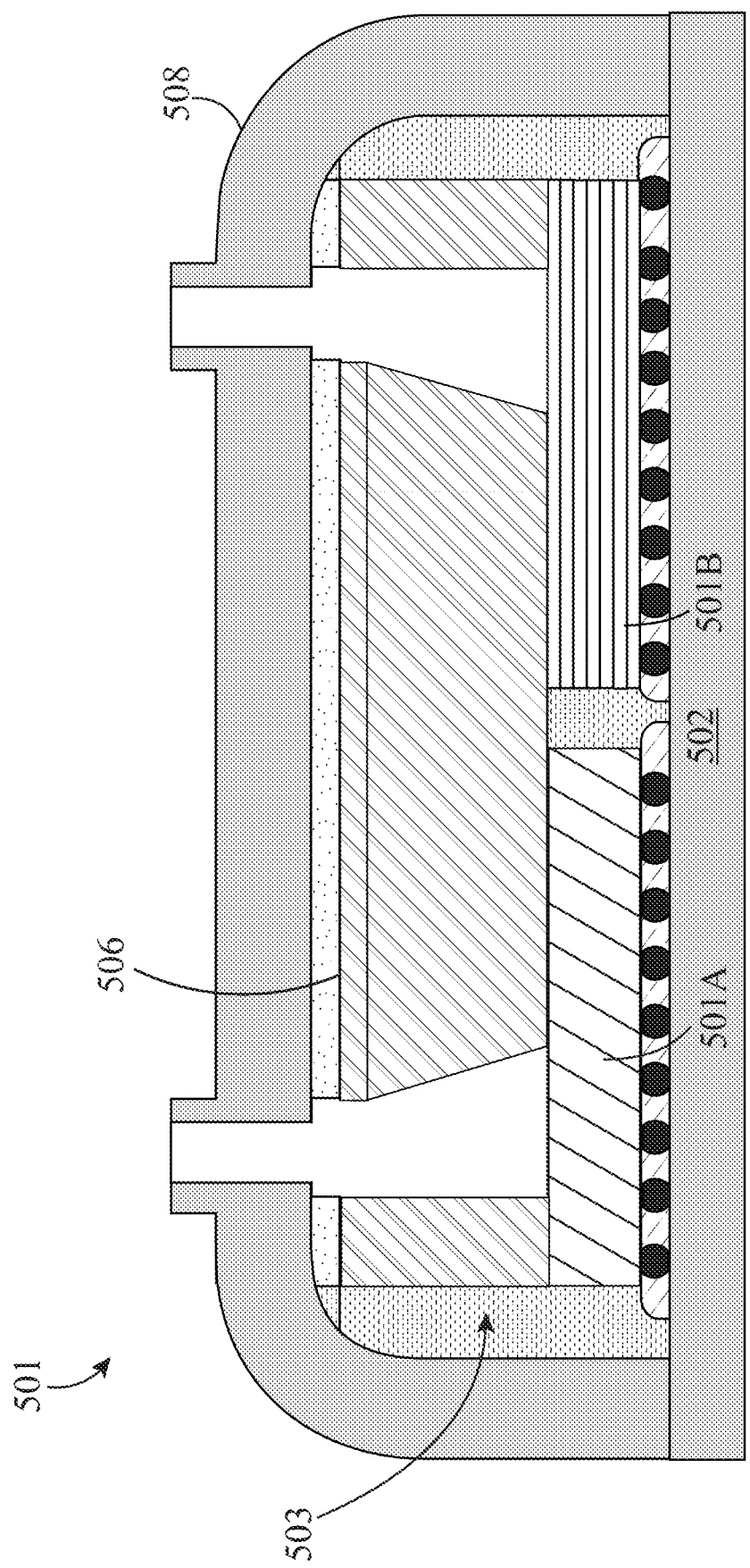
FIG. 5 is a schematic sectional view of another example device package, in accordance with embodiments of the present disclosure, that may be used with the system panel.

FIG. 5 is a schematic side sectional view in the X-Z plane of an example of a multi-component device package 501 that includes a cold plate 506 directly bonded to the backside surfaces of two or more devices 501A, 501B. The multi-component device package 501 may be similar to the device package 201 described above, and therefore the description of similar features is omitted for brevity. In some embodiments, the two or more devices 501A and 501B are singulated from reconstituted wafers and then bonded to the cold plate 506. As shown, the device package 501 includes a package substrate 502, an integrated cooling assembly 503 and a package cover 508. The integrated cooling assembly 503 may include a plurality of devices 501A (one shown) that may be singulated and/or disposed in a vertical device stack 501B (one shown). The cold plate 506 may be attached to each of the devices 501A and device stack 501B, e.g., by the direct bonding methods described herein or other methods including adhesive. In some embodiments, the device 501A may comprise a processor, and the device stack 501B may comprise a plurality of memory devices, such as a high bandwidth memory (HBM) comprising a bottom logic die and a plurality of memory (e.g., DRAM) dies stacked on the logic die. Here, the device 501A and the device stack 501B are disposed in a side-by-side arrangement on the package substrate 502 and are in electrical communication with one another through conductive elements formed in, on, or through the package substrate 502. Here, the cold plate 506 is sized to provide a bonding surface for attachment to both the device 501A and the device stack 501B but may otherwise be the same or substantially similar to other cold plates described herein. In some embodiments, the lateral dimensions (or footprint) of the cold plate 506 may be smaller or larger than the combined lateral dimensions (or footprint) of both the device 501A and the device stack 501B. In some embodiments, one or more sidewalls of the cold plate 506 may be aligned or offset to the vertical sidewalls of the device 501A and the device stack 501B (including inside or outside their footprint). In some embodiments, more than one cold plate 506 may be bonded. For example, separate cold plates may be bonded to the device 501A and the device stack 501B.

FIG. 6A and FIG. 6B are schematic sectional views in the X-Z plane of an integrated cooling assembly 603 which may be incorporated into the device package 201 in place of the integrated cooling assembly 203. With reference to an integrated cooling assembly shown in the X-Y plane in FIG. 7 (described below), FIG. 6A illustrates cross-section B-B' and FIG. 6B illustrated cross-section C-C'. Certain features of the integrated cooling assembly 603 illustrated in FIGS. 6A and 6B are similar to features described above in relation to the integrated cooling assembly 203 illustrated in FIG. 3, and therefore repeated description of those features will be omitted for brevity.

The integrated cooling assembly 603 includes a cold plate 606 attached to the backside 220 of the semiconductor device 204. The cold plate 606 (e.g., a lower side 602) may be attached to the semiconductor device 204 by direct dielectric bonds, direct hybrid bonds, or adhesive, as described herein.

The cold plate 606 of FIGS. 6A and 6B differs from the cold plate 203 described above in relation to FIG. 3 in that it includes an upper portion 634 (shown in FIG. 6A) disposed vertically adjacent to the backside 220 of the semiconductor device 204. A lower portion 636 (shown in FIG. 6B) of the cold plate is disposed between the upper portion 634 of the cold plate 606 and the backside 220 of the semiconductor device 204. That is, the upper portion 634 is positioned above the backside 220 of the semiconductor device 204 such that at least part of the upper portion 634 is located within the footprint of the semiconductor device 204. The lower portion 636 positioned between the upper portion 634 and the semiconductor device 204. In other words, the upper portion 634, the lower portion 634, and the semiconductor device 204 are vertically stacked, in that order.

The upper portion 634 includes upper coolant channels 610B defined by upper cavity sidewalls 642 and the lower portion includes lower coolant channels 610A defined by lower cavity sidewalls 632. The upper coolant channels 610B may be separated from the lower coolant channels 610A by the upper cavity sidewalls 642 and the lower cavity sidewalls 632. That is, portions of the cold plate 606 between the upper and lower cavity sidewalls 642, 632 may form cavity dividers, as discussed above in relation to FIG. 3, which may also form a fluid barrier between the upper and lower coolant channels 610B, 610A (e.g., to prevent fluid flowing through the upper coolant channels 610A from flowing into the lower coolant channels 610A, and vice-versa). Coolant fluid may flow through the upper coolant channels 610B and the lower coolant channels 610A, as shown by arrows extending through the channels in FIGS. 6A and 6B.

As shown in FIGS. 6A and 6B, a horizontal length of the upper coolant channels 610B in the X-axis direction may be different to a horizontal length of the lower coolant channels 610A in the X-axis direction. By forming the upper coolant channels 610B with a horizontal length less than a horizontal length of the lower coolant channels 610A, separate inlet and outlet openings may be provided for the upper coolant channels 610B and the lower coolant channels 610A, respectively. For example, the upper coolant channels 610B may be in fluid communication with first inlet and outlet openings 606B (shown in FIG. 6A) only. Similarly, the lower coolant channels 610A may be in fluid communication with second inlet and outlet openings 606A (shown in FIG. 6B) only. In some embodiments, the first inlet and outlet openings 606B and the second inlet and outlet openings 606A may be collectively referred to as inlet and outlet openings of the cold plate 606. The second inlet and outlet openings 606B may be formed laterally adjacent to the first inlet and outlet openings 606A. Advantageously, by providing separate inlet and outlet openings, as shown, the upper and lower coolant channels 610B, 610A may be connected to different (and separate) coolant fluids (e.g., different types of fluid and/or different flow rates of fluid). In some embodiments, the upper and lower coolant channels 610B, 610A may both be connected to the same coolant fluid.

The cold plate 606 may further include a channel cover 638 disposed on the upper portion 634 of the cold plate 606 (e.g., facing an upper side 608) to fluidly seal the upper coolant channels 610B. The channel cover 628 may include inlet and outlet openings 612 which are fluidly connected to the first inlet and outlet openings 606B and the second inlet and outlet openings 606A of the cold plate 606. The channel cover 638 may be attached to the cold plate 606 by direct dielectric bonds, direct hybrid bonds, or adhesive, as discussed herein. The channel cover 638 may be formed of the same or similar material to the cold plate 606 (e.g., polymer, copper, aluminum, silicon, glass, or ceramic).

Figure 7:
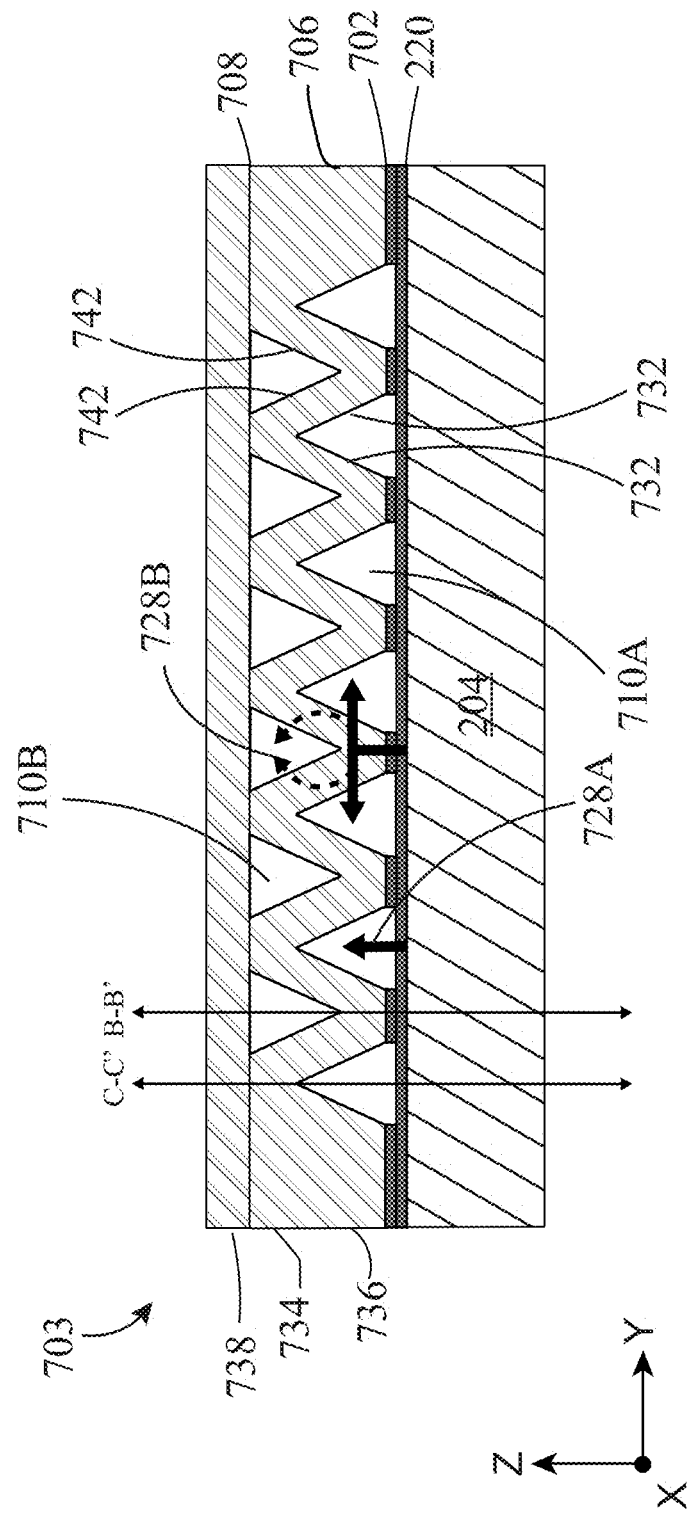
FIG. 7 is a schematic sectional view in the Y-Z plane of another integrated cooling assembly, in accordance with embodiments of the present disclosure.
Figure 9A:
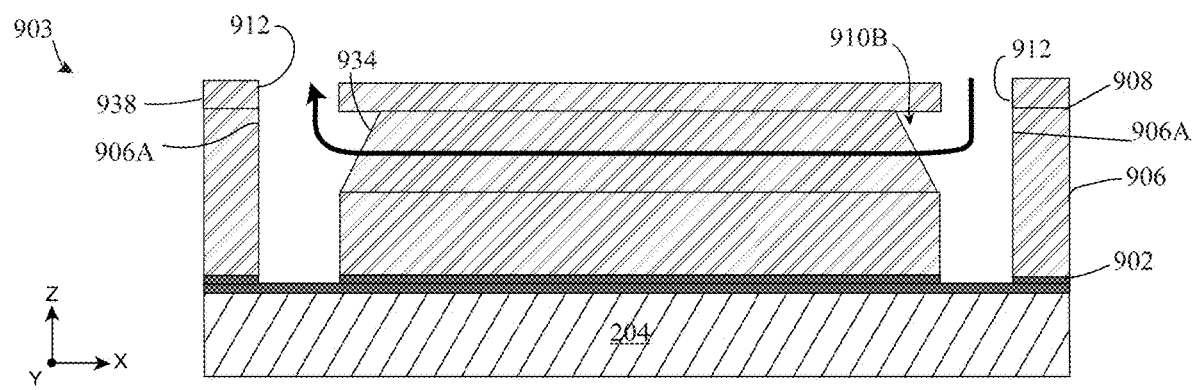
FIG. 9A is a schematic sectional view in the X-Z plane of another integrated cooling assembly, in accordance with embodiments of the present disclosure.
Figure 9B:
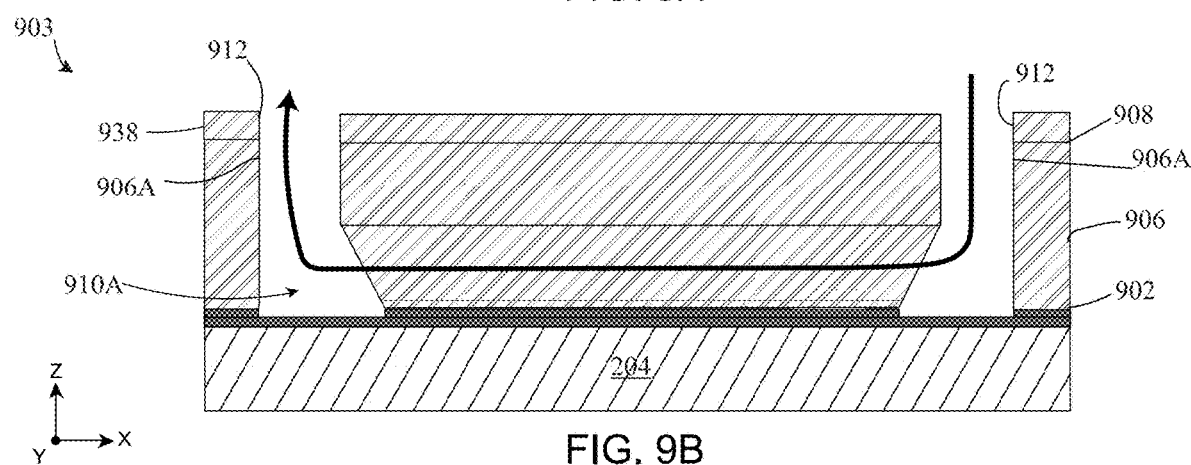
FIG. 9B is another schematic sectional view in the X-Z plane of the integrated cooling assembly illustrated in FIG. 9A, in accordance with embodiments of the present disclosure.

FIG. 7 is a schematic sectional view in the Y-Z plane of an integrated cooling assembly 703 including a cold plate 706 having upper and lower portions 734, 736 attached to the semiconductor device 204. The cold plate 706 includes upper coolant channels 710B defined by upper cavity sidewalls 742 and lower coolant channels 710A defined by lower cavity sidewalls 732. The sectional view shown in FIG. 7 illustrates an example sectional view in the X-Y plane of the integrated cooling assembly 603, described above, and the integrated cooling assembly 903, described below. With reference to FIGS. 6A-6B and FIGS. 9A-9B, the sectional view shown in FIG. 7 may be taken at a central line along the X-axis of the integrated cooling assembly 603 and the integrated cooling assembly 903. Hence, certain features of the integrated cooling assembly 703 illustrated in FIG. 7 are similar to integrated cooling assembly 603 and the integrated cooling assembly 903, and therefore repeated description of those features will be omitted for brevity. Different embodiments of the cross-section B-B' are illustrated in FIG. 6A and FIG. 9A. Similarly, different embodiments of the cross-section C-C' are illustrated in FIG. 6B and FIG. 9B.

As shown, the cold plate 706 includes a lower side 702 facing the backside 220 of the semiconductor device 204 and an upper side 708 opposite the lower side 702. Where a channel cover 738 is provided, the upper side 708 may be facing the channel cover 738. The lower cavity sidewalls 732 may extend upwardly into the lower portion 736 from the lower side 702 of the cold plate 706 to form the lower coolant channels 710A (which may be exposed to the backside 220 of the semiconductor device 204). The upper cavity sidewalls 742 may extend downwardly into the upper portion 734 from the upper side 708 of the cold plate 706 to form the upper coolant channels 710A. The exact shape and dimensions of the upper and lower coolant channels 710B, 710A may vary. For example, as shown, the upper cavity sidewalls 742 may be sloped to form the upper coolant channels 710B with a triangular cross-section. Similarly, the lower cavity sidewalls 732 may be sloped to form lower coolant channels 710A with a triangular cross-section. Although the upper and lower coolant channels 710B, 710A are illustrated as having triangular cross-sections, the upper and lower coolant channels 710B, 710A may instead have trapezoidal, rectangular, or semi-circular cross-section, or a combination thereof.

In embodiments illustrated by FIG. 7, the upper cavity sidewalls 742 extend downwardly into regions between adjacent lower coolant channels 710A and the lower cavity sidewalls 732 extend upwardly into regions between adjacent upper coolant channels 710B. Furthermore, the upper and lower coolant channels 710B, 710A are thus horizontally offset in the X-axis direction. As a result, portions of the upper coolant channels 710B vertically overlap in the Z-axis direction with portions of the lower coolant channels 710A. That is, a horizontal boundary between the upper and lower portions 732, 736 of the cold plate 706 is crossed by portions of the upper coolant channels 610B and portions of the lower coolant channels 610A. Therefore, the overlapping portions of the coolant channels are horizontally adjacent to each other such that thermal flux may flow between the upper and lower coolant channels 710B, 710A.

In FIG. 7, arrows 728A and 728B illustrate two different heat transfer paths in the integrated cooling assembly 703. A first heat transfer path illustrated by arrow 728A shows heat generated by the semiconductor device 204 transferring directly from the semiconductor material of the semiconductor device 204 to coolant fluid flowing through the lower coolant channels 710A of the cold plate 706. A second heat transfer path illustrated by arrows 728B shows heat generated by the semiconductor device 204 being transferred from semiconductor material (e.g., silicon material) of the semiconductor device 204 to semiconductor material (e.g., silicon material) of the cold plate 706, being propagated throughout the semiconductor material of the cold plate 706 (shown as dashed lines), and being transferring into coolant fluid flowing through the upper coolant channels 710B. Advantageously, by providing a cold plate with separate upper and lower coolant channels, the efficiency with which heat can be transferred away from a heat source (e.g., the semiconductor device 204) is improved. In particular, the volume of coolant fluid to which thermal energy may be transferred in increased, and, since cooling fluid has a high capacity for removing heat, the integrated cooling assemblies disclosed herein can accommodate relatively high power heat sources.

Figure 8:
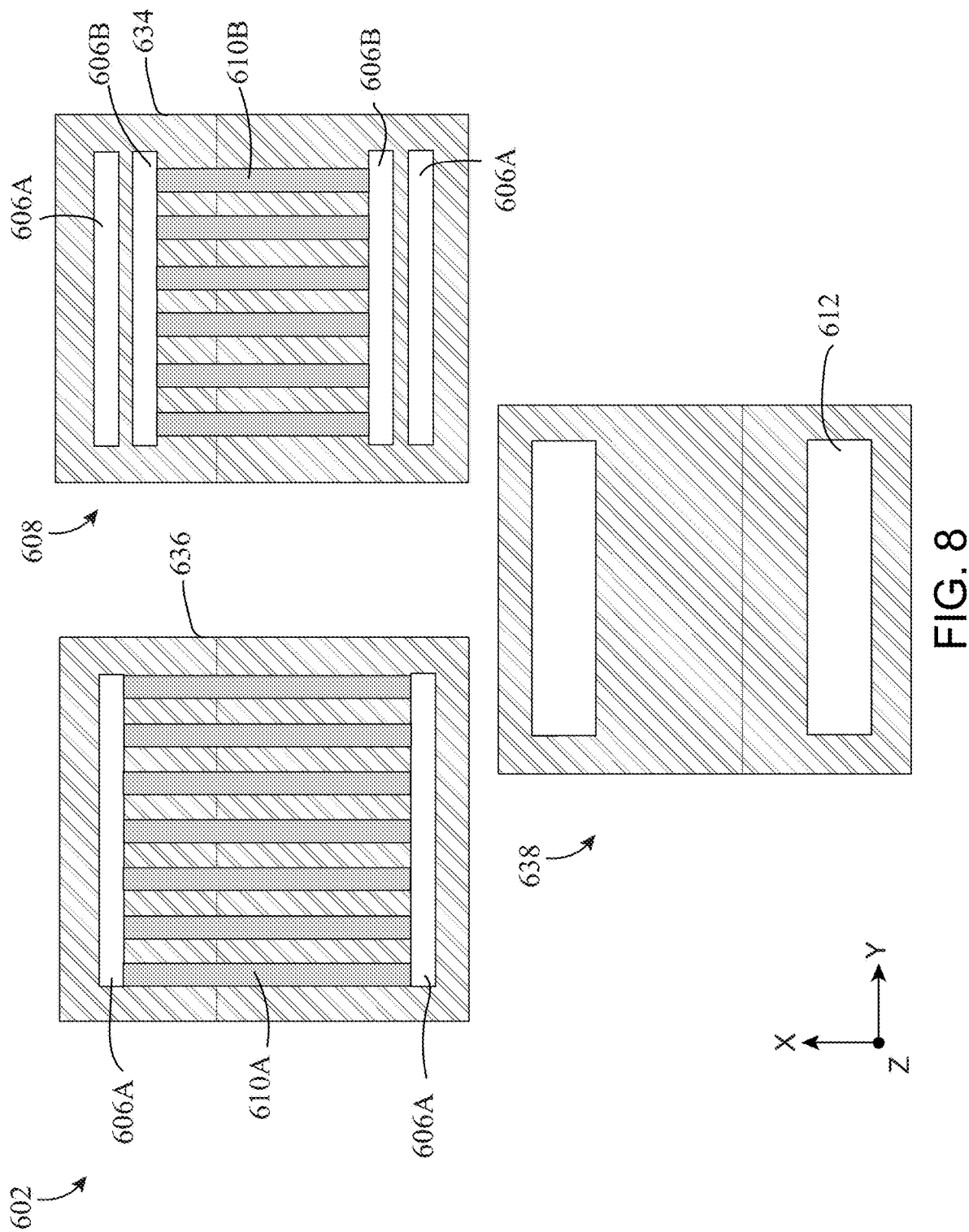
FIG. 8 shows schematic plan views of a cold plate and a channel cover of the integrated cooling assembly illustrated in FIG. 6A and FIG. 6B.

FIG. 8 shows schematic plan views of the cold plate 606 and the channel cover 638 illustrated in FIGS. 6A and 6B. The top left portion of FIG. 8 shows a plan view of the lower side 602 of the cold plate 606 facing the backside 220 of the semiconductor device 204. The top right portion of FIG. 8 shows a plan view of the upper side 608 of the cold plate 606 facing the channel cover 638. The bottom middle portion of FIG. 8 shows a plan view of the channel cover 638 (for which both sides may be the same).

Here, the lower coolant channels 610A extend in parallel between the second inlet and outlet openings 606A and the upper coolant channels 610B extend in parallel between the first inlet and outlet openings 606B. As shown in the plan view of the upper side 608, the second inlet and outlet openings 606A are separate from the first inlet and outlet openings 606B. Therefore, the second inlet and outlet openings 606A may supply coolant fluid to the lower coolant channels 610A only, while remaining separated from the upper coolant channels 610B. Similarly, the first inlet and outlet openings 606B may supply coolant fluid to the upper coolant channels 610B only, while remaining separated from the lower coolant channels 610A.

The inlet and outlet openings 612 of the channel cover 638 are shown to extend laterally across the inlet and outlet openings 606A, 606B of the cold plate 606 in the X-axis direction and the Y-axis direction. For example, the inlet opening 612 of the channel cover 638 may extend laterally across both the first inlet opening 606A and the second inlet opening 606B of the cold plate 606, and the outlet opening 612 of the channel cover 638 may extend laterally across both the first outlet opening 606A and the second outlet opening 606B of the cold plate 606. Further, the inlet and outlet openings 612 of the channel cover 638 may be laterally aligned (in the X-axis directions and the Y-axis direction) with corresponding inlet and outlet openings 606A, 606B disposed therebelow. As such, coolant fluid may flow through the inlet and outlet openings 612 of the channel cover 638 and into the cold plate 606 without being obstructed by the bulk material of the channel cover 638. In some embodiments, the channel cover 638 may include a first pair of inlet and outlet openings corresponding to the size and alignment of the first inlet and outlet openings 606A of the cold plate 606, and a second pair of inlet and outlet openings corresponding to the size and alignment of the second inlet and outlet openings 606B of the cold plate 606. That is, the channel cover 638 may include separate inlet and outlet openings for the upper coolant channels 610B and the lower coolant channels 610A in a similar manner to the inlet and outlet openings 606A, 606B of the cold plate 606.

FIG. 9A and FIG. 9B are schematic sectional views in the X-Z plane of an integrated cooling assembly 903 which may be incorporated into the device package 201 in place of the integrated cooling assembly 203. With reference to an integrated cooling assembly shown in the X-Y plane in FIG. 7 (described above), FIG. 9A illustrates cross-section B-B' and FIG. 6B illustrated cross-section C-C'. Certain features of the integrated cooling assembly 903 illustrated in FIGS. 9A and 9B are similar to features described above in relation to the integrated cooling assembly 203, of FIG. 3, and the integrated cooling assembly 603, of FIG. 6, and therefore repeated description of those features will be omitted for brevity.

The integrated cooling assembly 903 includes a cold plate 906 attached to the backside 220 of the semiconductor device 204. The cold plate 906 (e.g., a lower side 902) may be attached to the semiconductor device 204 by direct dielectric bonds, direct hybrid bonds, or adhesive, as described herein.

The cold plate 906 of FIGS. 9A and 9B differs from the cold plate 603 described above in relation to FIG. 6 in that a horizontal length of upper coolant channels 910B (shown in FIG. 9A) in the X-axis direction may be the same (or substantially the same) as a horizontal length of lower coolant channels 910A (shown in FIG. 9B) in the X-axis direction. By forming the upper coolant channels 910B and the lower coolant channels 910A with a same or similar length, a single pair of inlet and outlet openings 906A may be shared between the upper coolant channels 910B and the lower coolant channels 910A. For example, the upper coolant channels 910B and the lower coolant channels 910A may both be in fluid communication with the same inlet and outlet openings 906A. As such, a same coolant fluid may be supplied to both the upper coolant channels 910B and the lower coolant channels 910A from a same supply (as shown by arrows extending through the channels in FIGS. 9A and 9B), which may reduce the complexity of the integrated cooling assembly 903. It will be understood that, although the upper and lower coolant channels 910B, 910A may share the same supply of coolant fluid, once the coolant fluid enters the respective coolant channels the coolant fluid remains within the respective coolant channels and does not flow from the upper coolant channels 910B to the lower coolant channels 910A, or vice-versa.

As with the cold plate 606 of FIG. 6, the cold plate 906 illustrated in FIG. 9 may further include a channel cover 938 disposed on an upper portion 934 (e.g., facing an upper side 908) of the cold plate 906 to fluidly seal the upper coolant channels 910A. The channel cover 928 may include inlet and outlet openings 912 which are fluidly connected to the inlet and outlet openings 906A of the cold plate 906.

Figure 10:
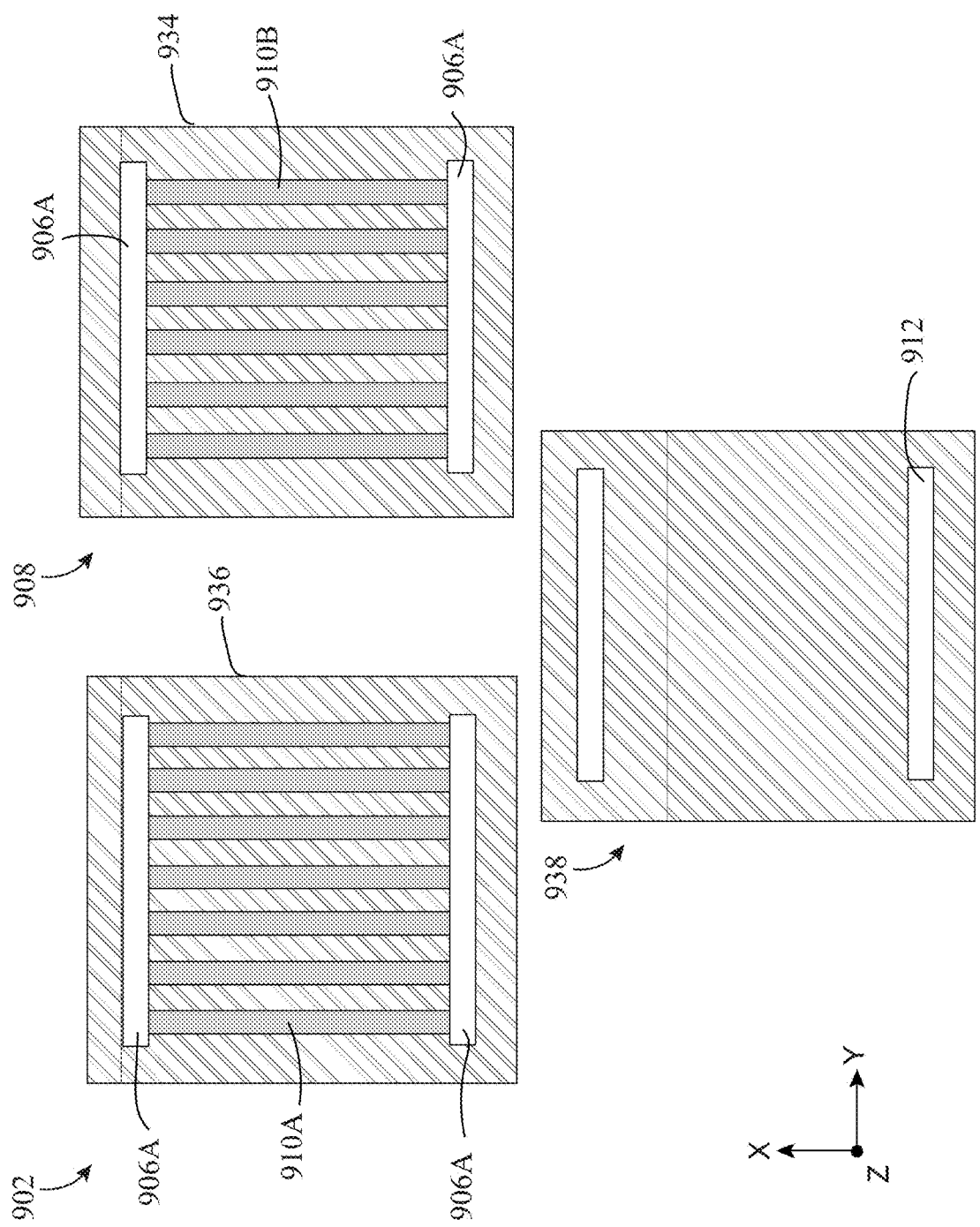
FIG. 10 shows schematic plan views of a cold plate and a channel cover of the integrated cooling assembly illustrated in FIG. 9A and FIG. 9B.

FIG. 10 shows schematic plan views of the cold plate 906 and the channel cover 938 illustrated in FIG. 9. The top left portion of FIG. 10 shows a plan view of the lower side 902 of the cold plate 606 facing the backside 220 of the semiconductor device 204. The top right portion of FIG. 10 shows a plan view of the upper side 908 of the cold plate 906 facing the channel cover 938. The bottom middle portion of FIG. 10 shows a plan view of the channel cover 938 (for which both sides may be the same).

Here, both the lower coolant channels 910A and the upper coolant channels 910B extend in parallel between the single pair of inlet and outlet openings 906A. As shown in the plan view of the upper side 908 and the plan view of the lower side 902, the inlet and outlet openings 906A are shared between both upper and lower coolant channels 910B, 910A, as opposed to having separate openings in the cold plate 606 illustrated in FIG. 8. Therefore, the inlet and outlet openings 906A may simultaneously supply coolant fluid to the lower coolant channels 610A and the upper coolant channels 610B.

Dimensions of the inlet and outlet openings 912 of the channel cover 938 are shown to be approximately (i.e., within a tolerance of between 0.5 mm and 2 mm) the same as dimensions of the single pair of inlet and outlet openings 906A of the cold plate 606. Further, the inlet and outlet openings 912 of the channel cover 938 may be vertically and horizontally aligned (in the X-axis directions and the Y-axis direction) with the single pair of inlet and outlet openings 906A disposed therebelow. As such, coolant fluid may flow through the inlet and outlet openings 612 of the channel cover 638 and into the cold plate 606 without being obstructed by the bulk material of the channel cover 938.

Figure 11:
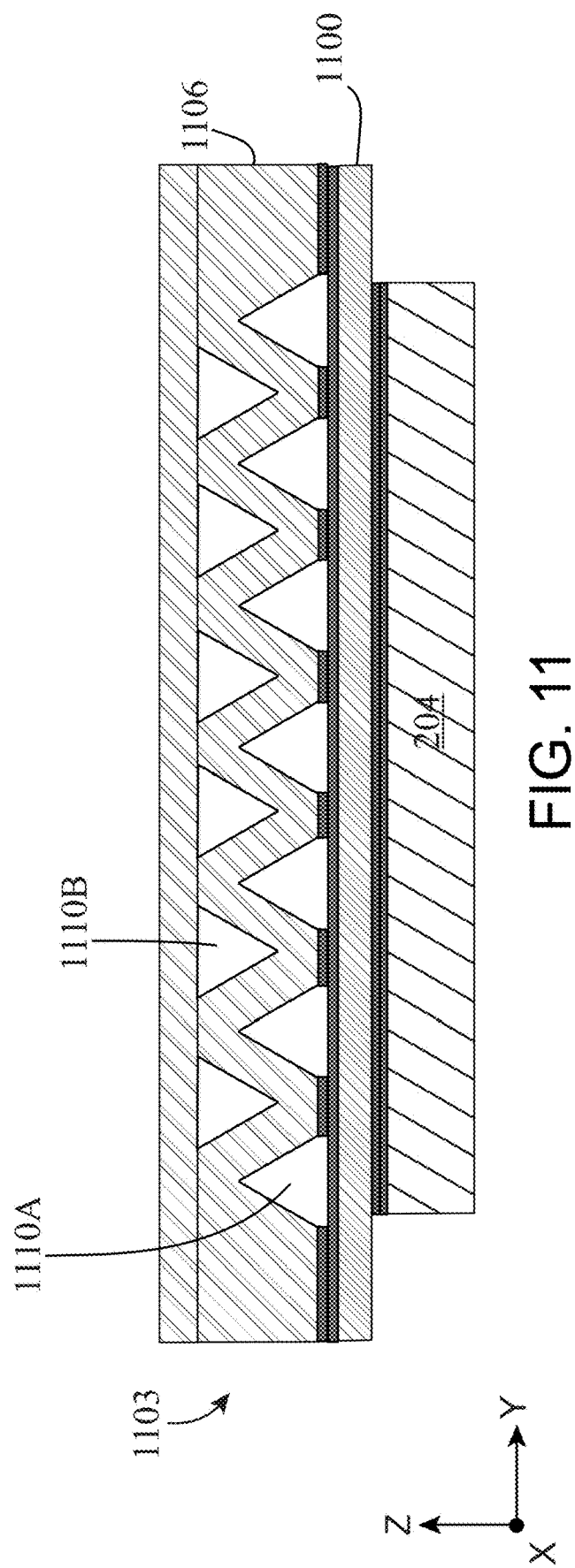
FIG. 11 is a schematic sectional view in the Y-Z plane of another integrated cooling assembly, in accordance with embodiments of the present disclosure.

FIG. 11 is a schematic sectional view in the X-Z plane of an integrated cooling assembly 1103. The integrated cooling assembly 1103 may be similar to the integrated cooling assembly 203 shown in FIG. 3. The integrated cooling assembly 1103 may also be similar to the integrated cooling assembly 603 or the integrated cooling assembly 903 shown in FIG. 6 and FIG. 9, respectively. Therefore, the description of similar features is omitted for brevity.

In FIG. 11, a width of a cold plate 1106 in a first direction is greater than a width of the semiconductor device 204 the first direction. The first direction may be taken to be a direction perpendicular to a second direction in which perimeter sidewall extends downwardly. Alternatively, the first direction may be taken to be a direction parallel with the backside 220 of the semiconductor device 204 (e.g. the X-axis direction or the Y-axis direction). With reference to FIGS. 11, the second direction is the Z-axis direction and the first direction is either the X-axis or the Y-axis direction. As shown, the width of the cold plate 1106 is greater than the width of the semiconductor device 204 in the Y-axis direction. In embodiments of FIG. 11 where the semiconductor device 204 has a rectangular footprint, the cold plate 1106 may extend beyond all four sidewalls of the semiconductor device 204. However, it will be understood that the width of the cold plate 1106 may be greater than the width of the semiconductor device 204 in either the X-axis direction or the Y-axis direction.

In order to provide the cold plate 1106 with a width greater than a width of the semiconductor device 204, a structural substrate 1100 having substantially the same width (in the X-axis direction and/or the Y-axis direction) as the cold plate 1106 is provided between the cold plate 1106 and the semiconductor device 204. The structural substrate 1100 provides structural rigidity to overhanging portions of the cold plate 1106 and also closes portions of lower coolant channels 1110A in the overhanging portions, which would otherwise be exposed. The structural substrate 1100 may be attached between the cold plate 1106 and the semiconductor device 204 using direct bonding techniques described herein.

Advantageously, by increasing the width of the cold plate 1106 in the X-axis direction and/or the Y-axis direction, as described above, additional coolant channels may be introduced to the cold plate 1106 in order to increase the efficiency of thermal cooling.

In some embodiments, only portions of lower coolant channels 1110A in the overhanging portions may be closed by the structural substrate 1100, while portions of lower coolant channels 1110A vertically adjacent to the semiconductor device 204 may be exposed to the backside 220 of the semiconductor device 204. For example, portions of the lower coolant channels 1110A vertically adjacent to the semiconductor device 204 may be exposed by etching openings in horizontally aligned portions of the structural substrate 1100.

In certain embodiments, the structural substrate 1100 may be omitted and instead the lower coolant channels 1110A may be formed vertically above the backside 220 of the semiconductor device 204 only, in order that the lower coolant channels 1110A are fluidly sealed against the backside 220. In such embodiments, upper coolant channels 1110B may be formed in regions laterally beyond the lower coolant channels 1110A in the X-axis direction and/or the Y-axis direction. Therefore, the cold plate 1106 may include more upper coolant channels 1110B than lower coolant channels 1110A and/or a horizontal length of the upper coolant channels 1110B in the X-axis direction may be greater than a horizontal length of the lower coolant channels 1110A in the X-axis direction.

Figure 12A:
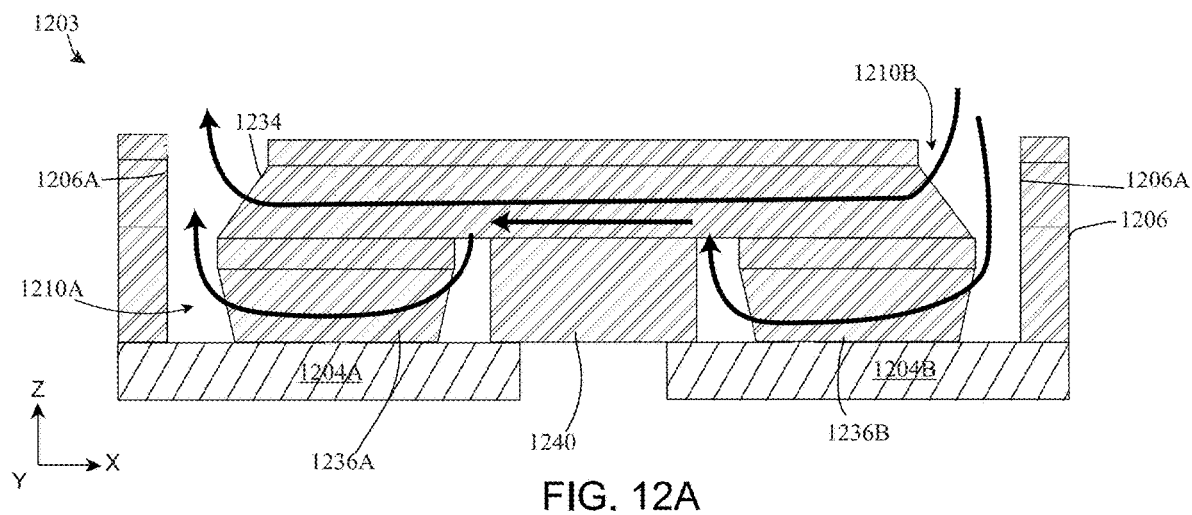
FIG. 12A is a schematic sectional view in the Y-Z plane of another integrated cooling assembly, in accordance with embodiments of the present disclosure.
Figure 12B:
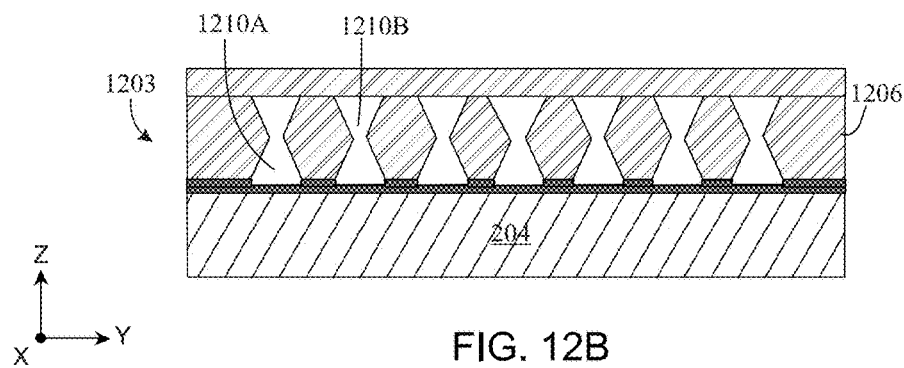
FIG. 12B is another schematic sectional view in the X-Z plane of the integrated cooling assembly illustrated in FIG. 12A, in accordance with embodiments of the present disclosure.

FIG. 12A is a schematic sectional view in the X-Z plane of an integrated cooling assembly 1203 and FIG. 12B is a schematic sectional view in the Y-Z plane of the integrated cooling assembly 1203. The integrated cooling assembly 1203 may be incorporated into the device package 201 in place of the integrated cooling assembly 203. Certain features of the integrated cooling assembly 1203 illustrated in FIGS. 12A and 12B are similar to features described above in relation to the integrated cooling assembly 703, of FIG. 7. The integrated cooling assembly 1203 may also be similar to the integrated cooling assembly 603 or the integrated cooling assembly 903 shown in FIG. 6 and FIG. 9, respectively. Therefore, repeated description of those features will be omitted for brevity.

The integrated cooling assembly 1203 includes a cold plate 1206 attached to the backside 220 of the semiconductor device 204. The cold plate 1206 may be attached to the semiconductor device 204 by direct dielectric bonds, direct hybrid bonds, or adhesive, as described herein.

The integrated cooling assembly 1203 of FIGS. 12A and 12B differs from the integrated cooling assembly 703 described above in relation to FIG. 7 in that the integrated cooling assembly 1203 comprises a plurality of semiconductor devices 1204A, 1204B each comprising a backside, and the cold plate 1206 is attached to the backside of each semiconductor device 1204A, 1204B.

The cold plate 1206 includes upper coolant channels 1210B and lower coolant channels 1210A which are horizontally aligned (in the Y-axis direction). The upper coolant channels 1210B are similar to other upper coolant channels described herein, in which a continuous single flow path is provided between inlet and outlet openings (as illustrated by the arrow extending through the upper coolant channels 1210B in FIG. 12A).

However, lower coolant channels 1210 are each divided into first lower channels 1236A and second lower channels 1236B, which are divided by a lower channel divider 1240. Here, at least one upper coolant channel 1210B is fluidly connected to at least one lower coolant channel 1210A, such that fluid may flow therebetween. Therefore, a flow path through a given lower coolant channel 1210 may be described as follows: fluid enters through an inlet opening 1206A and flows into the second lower channel 1236B, fluid flows upwardly from the second lower channel 1236B into at least one upper coolant channel 1210B and around the lower channel divider 1240, fluid flows downwardly from the at least one upper coolant channel 1210B into the first lower channel 1236A, and fluid exits through an outlet opening 1206A (as illustrated by the arrows extending through the lower coolant channels 1210A in FIG. 12A). The schematic sectional view shown in FIG. 12B is taken at a line in the Y-Z plane at which the at least one lower coolant channel 1210B (i.e., at least one first lower channel 1236A and/or at least one second lower channels 1236B) is fluidly connected to the at least one upper coolant channel 12010B. Although FIG. 12B illustrates that all the lower coolant channels 1210A are fluidly connected to the upper coolant channels 1210B, it will be understood that one or more lower coolant channels 1210A may be connected to one or more upper coolant channels 1210B.

FIG. 13 is a flow diagram showing a method 13800 of forming an integrated cooling assembly (such as the integrated cooling assemblies described herein), according to embodiments of the present disclosure. Generally, the method 1300 includes bonding a first substrate comprising one or more cold plates (such as the cold plates described herein) to a second substrate comprising one or more semiconductor devices, and singulating one or more integrated cooling assemblies from the bonded first and second substrates. For example, a wafer (bare or reconstituted wafer) comprising one or more cold plates can be directly bonded to another wafer (bare or reconstituted wafer) comprising one or more semiconductor devices.

It will be understood that the first substrate may be a cold plate die or part of a wafer of cold plates. Further, the second substrate may be a semiconductor device die or part of a wafer of semiconductor devices. Therefore, the method 1300 may include die-to-die direct bonding (e.g., cold plate die to semiconductor device die), wafer-to-die direct bonding (e.g., cold plate die to semiconductor device wafer, or cold plate wafer to semiconductor device die), and wafer-to-wafer direct bonding (e.g., cold plate wafer to semiconductor device wafer). It will be understood that the singulation step (discussed in relation to block 1360, below) may not be required for a die-to-die direct bonding operation.

For simplicity, the following description is focused on forming one integrated cooling assembly comprising one cold plate and one semiconductor device. However, as mentioned above, in some embodiments, the first substrate may comprise plural cold plates and the second substrate may comprise plural semiconductor devices, such that plural integrated cooling assemblies may be formed from the first and second substrates.

At block 1320, the method 1300 includes forming a first substrate comprising a cold plate, wherein the cold plate comprises upper cavity sidewalls defining upper coolant channels and lower cavity sidewalls defining lower coolant channels. The upper coolant channels, the lower coolant channels, inlet opening(s) and outlet opening(s) may be formed in the first substrate by etching using a patterned mask layer formed on its surface.

With reference to FIG. 8, a first patterned mask layer may be patterned on the lower side 602 of the cold plate 606 such that the lower coolant channels 610A extend between the second inlet and outlet openings 606A only and do not extend to the first inlet and outlet openings 606B. A second patterned mask later may be patterned on the upper side 608 of the cold plate 606 such that the upper coolant channels 610B are shorter than the lower coolant channels 610A, in order that the upper coolant channels 610B extend between the first inlet and outlet openings 606B only. It will be understood that the second inlet and outlet openings 606A are etched entirely through the cold plate 606 to fluidly connect the lower coolant channels 610A to the upper side 608 of the cold plate 606. The first inlet and outlet openings 606B are etched partially through the upper surface 608 of the cold plate 606 only, in order that the upper coolant channels 610B are fluidly connected to the upper side 608 of the cold plate 606.

With reference to FIG. 10, a first patterned mask layer may be patterned on the lower side 902 of the cold plate 906 and a second patterned mask layer may be patterned on the upper side 908 of the cold plate 906 such that both the lower coolant channels 910A and the upper coolant channels 910B extend between a single pair of inlet and outlet openings 906A. In such embodiments, the upper and lower coolant channels 910B, 910A are the same (or substantially the same) length in the X-axis direction. It will be understood that the inlet and outlet openings 906A are etched entirely through the cold plate 906 to fluidly connect the upper and lower coolant channels 910B, 910A to each other and to the upper side 908 of the cold plate 906.

In some embodiments, a channel cover (such as channel cover 638) comprising inlet and outlet openings may be formed and directly bonded to the cold plate. In such embodiments, the same etching and bonding techniques described herein may be used to form the channel cover. An anisotropic etch process may be used, which uses inherently differing etch rates for the silicon material as between {100} plane surfaces and {111} plane surfaces when exposed to an anisotropic etchant.

In some embodiments, the etching process is controlled to where a ratio of the etch rate in the {100} plane to the etch rate in the {111} plane is between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide ($HN_4OH$), hydrazine ($N_2H_4$), or tetra methyl ammonium hydroxide (TMAH). The actual etch rates of the silicon substrate depend on the concentration of the etchant in the aqueous solution, the temperature of the aqueous solution, and a concentration of the dopant in the substrate (if any). Typically, the mask layer is formed of a material that is selective to anisotropic etch compared to the underlying monocrystalline silicon substrate. Examples of suitable mask materials include silicon oxide ($Si_xO_y$) or silicon nitride ($Si_xN_y$). In some embodiments, the mask layer has a thickness of about 100 nm or less, such as about 50 nm or less, or about 30 nm or less. The mask layer may be patterned using any suitable combination of lithography and material etching patterning methods.

At block 1340, the method 1800 includes directly bonding the first substrate (e.g., a monocrystalline silicon wafer) comprising a cold plate to the second substrate (e.g., a monocrystalline silicon wafer) comprising a semiconductor device. By direct bonding, it is meant that the bond is effected without an intervening adhesive.

The second substrate may include a bulk material, and a plurality of material layers disposed on the bulk material. The bulk material may include any semiconductor material suitable for manufacturing semiconductor devices, such as silicon, silicon carbide, silicon germanium, germanium, group III-V semiconductor materials, group II-VI semiconductor materials, or combinations thereof. While some high-performance processors like CPUs, GPUs, neural processing units (NPUs), and tensor processing units (TPUs) are typically made out of silicon, some other high power density (hence substantial heat-generating) devices may comprise silicon carbide or gallium nitride, for example. In some embodiments, the second substrate may include a monocrystalline wafer, such as a silicon wafer, a plurality of device components formed in or on the silicon wafer, and a plurality of interconnect layers formed over the plurality of device components. In other embodiments, the second substrate may comprise a reconstituted substrate, e.g., a substrate formed from a plurality of singulated devices embedded in a support material. In some embodiments, each semiconductor device may have its own individual cold plate fabricated through a reconstitution process.

The bulk material of the second substrate may be thinned after the semiconductor device is formed using one or more backgrinding, etching, and polishing operations that remove material from the backside. Thinning the second substrate may include using a combination of grinding and etching processes to reduce the thickness (in the Z-direction) to about 450 µm or less, such as about 200 µm or less, or about 150 µm or less or about 50 µm or less. After thinning, the backside may be polished to a desired smoothness using a chemical mechanical polishing (CMP) process, and the dielectric material layer may be deposited thereon. In some embodiments, the dielectric material layer may be polished to a desired smoothness to prepare the second substrate for the bonding process. In some embodiments, the method 1300 includes forming a plurality of metal features in the dielectric material layer in preparation for a hybrid bonding process, such as by use of a damascene process.

In some embodiments, the active side of the second substrate is temporarily bonded to a carrier substrate (not shown) before the thinning process. When used, the carrier substrate provides support for the thinning operation and/or for the thinned material to facilitate substrate handling during one or more of the subsequent manufacturing operations described herein.

Here, the method 1300 may include forming dielectric layers on one or both the first and second substrates, and directly bonding includes forming dielectric bonds between a first dielectric material layer of the first substrate and a second dielectric material layer of the second substrate (or forming direct dielectric bonds between one substrate (which may have a native oxide layer at its bonding surface) and a dielectric material layer of the other substrate). Direct bonding processes join dielectric layers by forming strong chemical bonds (e.g., covalent bonds) between the dielectric layers.

Generally, directly bonding the surfaces (of the dielectric material layers formed on the first and second substrates) includes preparing, aligning, and contacting the surfaces. Examples of dielectric material layers include silicon oxide, silicon nitride, silicon oxynitride, and silicon carbonitride. Preparing the surfaces may include smoothing the respective surfaces to a desired surface roughness, such as between 0.1 to 3.0 nm RMS, activating the surfaces (e.g., a "very slight etch" using plasma or wet chemical treatment as taught in U.S. Pat. No. 6,902,987) to weaken or open chemical bonds in the dielectric material, and terminating the surfaces with a desired species (e.g., also as described in U.S. Pat. No. 6,902,987). Smoothing the surfaces may include polishing the first and second substrates using a CMP process. Simultaneously activating and terminating the surfaces with a desired species may include exposing the surfaces to radical species formed in a plasma. The bond interface between the bonded dielectric layers can include a higher concentration of materials from the activation and/or last chemical treatment processes compared to the bulk of the bonding layers. For example, in some embodiments that utilize a nitrogen plasma for activation that terminates the bonding surface with a nitrogen-containing species, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen concentration peak can be formed at the bond interface between non-conductive bonding surfaces. Such an oxygen concentration peak will be more detectable when the bonding layers do not contain oxygen, such as layers containing silicon nitride or silicon carbon nitride.

In some embodiments, the plasma is formed using a nitrogen-containing gas, e.g., $N_2$, and the terminating species includes nitrogen, or nitrogen and hydrogen. In some embodiments, fluorine may also be present within the plasma. In some embodiments, the surfaces may be activated using a wet cleaning or etching process, e.g., by exposing the surfaces to an aqueous ammonia solution (e.g., ammonium hydroxide). In some embodiments, the dielectric bonds may be formed using a dielectric material layer deposited on only one of the first and second substrates, but not on both. In those embodiments, the direct dielectric bonds may be formed by contacting the deposited dielectric material layer of one of the first and second substrates directly with a bulk material surface (or such a surface with a native oxide) of the other substrate.

Directly forming direct dielectric bonds between the first and second substrates at block 1340 may include bringing the prepared and aligned surfaces into direct contact at a temperature less than 150° C., such as less than 100° C., for example, less than 30° C., or about room temperature, e.g., between 20° C. and 30° C. Without intending to be bound by theory, in the case of directly bonding surfaces terminated with nitrogen and hydrogen (e.g., $NH_2$ groups), it is believed that a chemical bond is formed in part from the nitrogen species, wherein hydrogen gas byproducts ($H_2$ gas) of the chemical reaction diffuse away from the interfacial bonding surfaces. In some embodiments, the direct bond is strengthened using an anneal process, where the substrates are heated to and maintained at a temperature of greater than about 30° C. and less than about 450° C., for example, greater than about 50° C. and less than about 250° C., or about 150° C., for a duration of about 5 minutes or more, such as about 15 minutes. Typically, the bonds will strengthen over time even without the application of heat. Thus, in some embodiments, the method does not include heating the substrates.

In embodiments where the first and second substrates are bonded using hybrid dielectric and metal bonds, the method 1300 may further include planarizing or recessing the metal features below the dielectric field surface before contacting and bonding the dielectric material layers. After the dielectric bonds are formed, the first and second substrates may be heated to a temperature of 150° C. or more and maintained at the elevated temperature for a duration of about 1 hour or more, such as between 8 and 24 hours, to form direct metallurgical bonds between the metal features.

Suitable direct dielectric and hybrid bonding technologies that may be used to perform aspects of the methods described herein include ZiBond® and DBI®, each of which are commercially available from Adeia Holding Corp., San Jose, CA, USA.

At block 1360, the method 1300 includes singulating at least one integrated cooling assembly from the bonded first and second substrates. Singulation after bonding may impart distinctive structural characteristics on the integrated cooling assembly as the cold plate has the same perimeter as the semiconductor device bonded thereto. Thus, the sidewalls (e.g., side surfaces) of the cold plate are typically flush with the sidewalls (e.g., side surfaces) of the semiconductor device about their common perimeters. In some embodiments, the cold plate is singulated from the first substrate using a process that cuts or divides the first substrate in a vertical plane, i.e., in the Z-direction. In those embodiments, the side surfaces of the cold plate are substantially perpendicular to the backside of the semiconductor device, i.e., a horizontal (X-Y) plane of an attachment interface between the semiconductor device and the cold plate. In some embodiments, the cold plate is singulated using a saw or laser dicing process.

At block 1380, the method 1300 may include connecting the integrated cooling assembly to the package substrate 202 and sealing a package cover 208 comprising inlet and outlet openings 212 to the integrated cooling assembly by use of a sealing material layer 222, such as a molding compound that is cured.

At block 1400, the method 1300 may include, before or after sealing the package cover 208 to the integrated cooling assembly, forming inlet and outlet openings 222A in the sealing material layer 222 to fluidly connect the inlet and outlet openings 212 of the package cover 208 to the cold plate.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure.

What is claimed is:

1. An integrated cooling assembly comprising:
    a semiconductor device;
    a cold plate attached to a backside of the semiconductor device, the cold plate comprising:
        an upper portion disposed vertically adjacent to the backside of the semiconductor device; and
        a lower portion disposed between the upper portion of the cold plate and the backside of the semiconductor device, wherein:
            the upper portion comprises upper coolant channels defined by upper cavity sidewalls;
            the lower portion comprises lower coolant channels defined by lower cavity sidewalls;
            the upper cavity sidewalls extend downwardly into regions between adjacent lower coolant channels; and
            the lower cavity sidewalls extend upwardly into regions between adjacent upper coolant channels.

2. The integrated cooling assembly of claim 1, wherein the upper coolant channels are separated from the lower coolant channels by the upper cavity sidewalls and the lower cavity sidewalls.

3. The integrated cooling assembly of claim 1, wherein the cold plate comprises:
    a lower side facing the backside of the semiconductor device and an upper side opposite the lower side, wherein:
        the lower cavity sidewalls extend upwardly into the lower portion from the lower side of the cold plate to form the lower coolant channels; and
        the upper cavity sidewalls extend downwardly into the upper portion from the upper side of the cold plate to form the upper coolant channels.

4. The integrated cooling assembly of claim 1, wherein the cold plate comprises a channel cover disposed on the upper portion of the cold plate to fluidly seal the upper coolant channels.

5. The integrated cooling assembly of claim 4, wherein the channel cover is attached to the upper portion by direct dielectric bonds, direct hybrid bonds, or adhesive.

6. The integrated cooling assembly of claim 1, wherein the upper coolant channels are horizontally offset from the lower coolant channels.

7. The integrated cooling assembly of claim 1, wherein:
    the upper cavity sidewalls are sloped to form upper coolant channels with a triangular cross-section; and
    the lower cavity sidewalls are sloped to form lower coolant channels with a triangular cross-section.

8. The integrated cooling assembly of claim 1 wherein a width of the cold plate in a direction parallel with the backside of the semiconductor device is greater than a width of the semiconductor device in the same direction.

9. The integrated cooling assembly of claim 1, wherein the cold plate is attached to the semiconductor device by direct dielectric bonds or direct hybrid bonds.

10. The integrated cooling assembly of claim 1, wherein:
    the integrated cooling assembly comprises a plurality of semiconductor devices each comprising a backside; and
    the cold plate is attached to the backside of each semiconductor device.

11. The integrated cooling assembly of claim 10, wherein at least one upper coolant channel is fluidly connected to at least one lower coolant channel.

12. The integrated cooling assembly of claim 10, wherein the upper coolant channels are horizontally aligned with the lower coolant channels.

13. The integrated cooling assembly of claim 1, wherein:
    the cold plate further comprises inlet and outlet openings; and
    the upper coolant channels and the lower coolant channels are in fluid communication with the inlet and outlet openings.

14. The integrated cooling assembly of claim 13, wherein a length of the upper coolant channels between the inlet and outlet openings is less than a length of the lower coolant channels between the inlet and outlet openings.

15. A device package comprising the integrated cooling assembly of claim 1, the device package comprising a package substrate, wherein the integrated cooling assembly is attached to the package substrate.

16. The device package of claim 15, further comprising a package cover disposed over the integrated cooling assembly, wherein:
    the package cover comprises an inlet opening and an outlet opening disposed therethrough; and
    the upper coolant channels and the lower coolant channels are in fluid communication with the inlet opening and the outlet opening of the package cover.

17. A method of manufacturing the integrated cooling assembly of claim 1, the method comprising:
    forming a first substrate comprising a cold plate, wherein the cold plate comprises upper cavity sidewalls defining upper coolant channels and lower cavity sidewalls defining lower coolant channels; and
    directly bonding the cold plate to a second substrate comprising a semiconductor device.

18. The method of claim 17, further comprising:
singulating an integrated cooling assembly from the bonded first and second substrates.

19. The method of claim 18, further comprising:
connecting the integrated cooling assembly to a package substrate and sealing a package cover comprising inlet and outlet openings to the integrated cooling assembly.

20. The method of claim 19, further comprising:
before or after sealing the package cover to the integrated cooling assembly, forming inlets and outlets in a sealing material layer to fluidly connect the inlet and outlet opening of the package cover to the cold plate.

* * * * *